(12) United States Patent
Yoon et al.

(10) Patent No.: US 12,277,976 B2
(45) Date of Patent: Apr. 15, 2025

(54) STORAGE DEVICE, NON-VOLATILE MEMORY, AND METHOD OF OPERATING PROGRAM OF NON-VOLATILE MEMORY INCLUDING COUNTING A NUMBER OF ON-CELLS DURING VERIFICATION

(71) Applicant: Samsung Electronics Co., Ltd., Suwon-si (KR)

(72) Inventors: Hyunjun Yoon, Suwon-si (KR); Jinwoo Park, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 232 days.

(21) Appl. No.: 17/941,570

(22) Filed: Sep. 9, 2022

(65) Prior Publication Data

US 2023/0091724 A1   Mar. 23, 2023

(30) Foreign Application Priority Data

Sep. 17, 2021   (KR) .................. 10-2021-0125222
Jun. 28, 2022   (KR) .................. 10-2022-0079275

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0483* (2013.01); *G11C 16/08* (2013.01); *G11C 16/30* (2013.01); *G11C 16/3459* (2013.01)

(58) Field of Classification Search
None
See application file for complete search history.

(56) References Cited

U.S. PATENT DOCUMENTS 9,318,191 B2   4/2016   Kwak et al.
9,779,833 B2   10/2017  Joo et al.
(Continued)

FOREIGN PATENT DOCUMENTS

KR   10-2010-0117904 A   11/2010

OTHER PUBLICATIONS

EP Extended European Search Report for corresponding European Patent Application No. 22195148.6 issued on Feb. 14, 2023.
(Continued)

*Primary Examiner* — J. H. Hur
(74) *Attorney, Agent, or Firm* — Harness, Dickey & Pierce, P.L.C.

(57) ABSTRACT

Provided are a non-volatile memory device, a storage device including the same, and a method of performing a programming operation on the same. The method includes performing a program operation including applying a desired first program voltage to a selected word line of the memory device, the selected word line including a plurality of memory cells, performing a verification operation including sensing a first sensing value corresponding to an output of the selected word line based on a first verify voltage, and counting a number of on-cells of the selected word line based on the first sensing value to determine a first count value, determining whether a first program state of the selected word line has been verified based on the first count value and at least one reference value, and setting a second program voltage based on results of the determining whether the first program state has been verified.

20 Claims, 15 Drawing Sheets

(51) Int. Cl.
*G11C 16/08* (2006.01)
*G11C 16/30* (2006.01)
*G11C 16/34* (2006.01)

(56) References Cited

U.S. PATENT DOCUMENTS

| | | | |
|---|---|---|---|
| 10,366,769 B2 | 7/2019 | Cho et al. | |
| 10,607,693 B2 | 3/2020 | Cariello et al. | |
| 10,910,075 B2 | 2/2021 | Yang et al. | |
| 2008/0148115 A1* | 6/2008 | Sokolov | G11C 11/5642 |
| | | | 714/719 |
| 2009/0073772 A1 | 3/2009 | Ha | |
| 2009/0154244 A1* | 6/2009 | Shiga | G11C 29/028 |
| | | | 365/185.11 |
| 2010/0124120 A1* | 5/2010 | Park | G11C 16/0483 |
| | | | 365/185.18 |
| 2010/0329004 A1* | 12/2010 | Hemink | G11C 16/10 |
| | | | 365/185.24 |
| 2011/0179322 A1* | 7/2011 | Lee | G11C 16/3454 |
| | | | 714/719 |
| 2011/0199833 A1* | 8/2011 | Shim | G11C 16/14 |
| | | | 365/185.23 |
| 2016/0148695 A1* | 5/2016 | Kim | G11C 29/42 |
| | | | 365/185.12 |
| 2016/0343444 A1 | 11/2016 | Park et al. | |
| 2018/0158528 A1 | 6/2018 | Lee | |
| 2019/0206497 A1 | 7/2019 | Lim et al. | |
| 2020/0152282 A1* | 5/2020 | Yang | G11C 16/3459 |
| 2021/0193239 A1 | 6/2021 | Suzuki et al. | |

OTHER PUBLICATIONS

EP Office Action for corresponding European Patent Application No. 22195148.6 issued on Sep. 16, 2024.

* cited by examiner

STORAGE DEVICE, NON-VOLATILE MEMORY, AND METHOD OF OPERATING PROGRAM OF NON-VOLATILE MEMORY INCLUDING COUNTING A NUMBER OF ON-CELLS DURING VERIFICATION

CROSS-REFERENCE TO RELATED APPLICATIONS

This U.S. non-provisional application is based on and claims the benefit of priority under 35 U.S.C. § 119 to Korean Patent Application Nos. 10-2021-0125222, filed on Sep. 17, 2021, and 10-2022-0079275, filed on Jun. 28, 2022, in the Korean Intellectual Property Office, the disclosures of each of which are incorporated by reference herein in their entireties.

BACKGROUND

Various example embodiments of the inventive concepts relate to an electronic device, a storage device, a non-volatile memory, and/or a method of operating a program of a non-volatile memory.

Semiconductor memory devices may be classified into volatile memories, such as dynamic random access memory (DRAM) and/or static RAM (SRAM), etc., and non-volatile memories, such as electrically erasable programmable read-only memory (EEPROM), ferroelectric RAM (FRAM), phase RAM (PRAM), magnetic RAM (MRAM), and/or flash memory, etc. A volatile memory device loses stored data when the power supply to the volatile memory device is cut off (e.g., turned off), whereas a non-volatile memory device retains stored data even when power to the non-volatile memory device is cut off (and/or turned off).

Devices using non-volatile memory include, for example, MP3 players, digital cameras, mobile phones, camcorders, flash cards, and/or solid state disks (SSDs), etc. As the number and types of devices using non-volatile memory as storage devices increase, the storage capacity of non-volatile memory is also rapidly increasing.

As a programming method for non-volatile memory, a programming operation by an Increment Step Pulse Program (ISPP) method may be used, and after a program voltage pulse is provided to the memory cells, the program state of the memory cells may be verified using a verify voltage. Accordingly, research to reduce the total program time is increasing.

SUMMARY

Various example embodiments of the inventive concepts provide a storage device, a non-volatile memory, and/or a method of operating a program of a non-volatile memory, etc., for improving the speed, efficiency, and power consumption of a program operation.

According to an aspect of at least one example embodiment of the inventive concepts, there is provided a method for performing at least one program loop on non-volatile memory device, wherein a first program loop of the at least one program loop includes performing a first program operation, the first program operation including applying a desired first program voltage to a selected word line of the memory device, the selected word line including a plurality of memory cells, performing a first verification operation, the first verification operation including sensing a first sensing value corresponding to an output of the selected word line based on a first verify voltage, and performing a pass check operation, the pass check operation including counting a number of on-cells of the selected word line based on the first sensing value to determine a first count value, determining whether a first program state of the selected word line has been verified based on the first count value and at least one reference value, and setting a second program voltage for a second program loop of the at least one program loop based on results of the determining whether the first program state has been verified.

According to another aspect of at least one example embodiment of the inventive concepts, there is provided a non-volatile memory device including a memory cell array including a plurality of memory cells, a voltage generator connected to the memory cell array through a plurality of word lines, the voltage generator configured to provide a voltage to a selected word line among the plurality of word lines, a page buffer circuit connected to the memory cell array through a plurality of bit lines, the page buffer circuit configured to sense a sensing value of the selected word line through each bit line, and control logic circuitry configured to perform at least one program loop on the plurality of memory cells, the at least one program loop including, performing a first program loop of the at least one program loop, controlling the voltage generator to apply a first program voltage to the selected word line during the first program loop, controlling the voltage generator to apply a first verify voltage to the selected word line during the first program loop, controlling the page buffer circuit to sense a first sensing value corresponding to an output of the selected word line based on the first verify voltage, and counting a number of on-cells of the selected word line based on the first sensing value to determine a first count value, determining whether a first program state of the selected word line has been successfully verified based on the first count value and at least one desired reference value, and setting a second program voltage for a second program loop of the at least one program loop based on results of determining whether the first program state of the selected word line has been successfully verified.

According to another aspect of at least one example embodiment of the inventive concepts, there is provided a method of for performing at least one program loop on a non-volatile memory device, the memory device including a plurality of single-level cells, the method comprising, performing a first program loop on the non-volatile memory device, the first program loop including, performing a program operation on a selected word line of the memory device, the program operation including applying a first program voltage, performing a verification operation, the verification operation including sensing a first sensing value corresponding to an output of the selected word line based on a first verify voltage, and performing a pass check operation, the pass check operation including counting a number of on-cells of the selected word line based on the first sensing value to determine a first count value, determining whether a program state of the selected word line has been verified based on the first count value and a plurality of reference ranges, and setting a second program voltage for a second program loop of the at least one program loop based on results of the determining whether the program state of the selected word line has been verified.

According to another aspect of the inventive concepts, there is provided a storage device including a memory controller and a non-volatile memory device, wherein the non-volatile memory device comprises, a memory cell array including a plurality of memory cells, a voltage generator connected to the memory cell array through a plurality of word lines, the voltage generator configured to provide a voltage to a selected word line among the plurality of word lines, a page buffer circuit connected to the memory cell array through a plurality of bit lines, the page buffer circuit configured to sense a sensing value of the selected word line through each bit line, and control logic circuitry configured to perform a first program loop on the plurality of memory cells, the first program loop including, controlling the voltage generator to apply a first program voltage to the selected word line during the first program loop, controlling the voltage generator to apply a first verify voltage to the selected word line during the first program loop, controlling the page buffer circuit to sense a first sensing value corresponding to an output of the selected word line based on the first verify voltage, and counting a number of on-cells based on the first sensing value to determine a first count value determines whether a first program state of the selected word line has been successfully verified based on the first count value and at least one desired reference value, and set a second program voltage for a second program loop based on results of determining whether the first program state has been successfully verified.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Hereinafter, various example embodiments of the inventive concepts will be described in detail with reference to the accompanying drawings.

Figure 1:
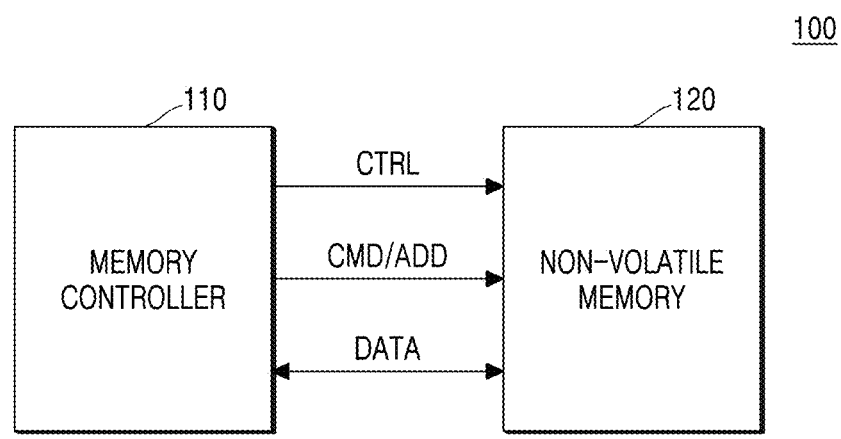
FIG. 1 is a diagram for explaining a storage device according to at least one example embodiment.

FIG. 1 is a diagram for explaining a storage device 100 according to at least one example embodiment.

Referring to FIG. 1, the storage device 100 may include a memory controller 110 and/or a non-volatile memory 120, etc., but the example embodiments are not limited thereto, and for example may include a greater or lesser number of constituent components. For example, the storage device 100 may include a plurality of non-volatile memories, at least one volatile memory, additional controllers and/or processing circuitry, etc.

The memory controller 110 may control the non-volatile memory 120 to read data DATA stored in the non-volatile memory 120, and/or write (and/or program) the data DATA to the non-volatile memory 120, in response to a write/read request from a host (e.g., a host device, an external device, etc.), but the example embodiments are not limited thereto. For example, the memory controller 110 may control program, read, and/or erase operations, etc., performed on the non-volatile memory 120 by providing a command/address CMD/ADD and/or a control signal CTRL, etc., to the non-volatile memory 120. Also, data to be written and data to be read may be transmitted/received between the memory controller 110 and the non-volatile memory 120, etc., but is not limited thereto.

The memory controller 110 may communicate with an external host through various interfaces. For example, the memory controller 110 includes an interface circuit (not shown), and the interface circuit may provide various standard and/or communication protocol interfaces between the host and the memory controller 110, etc. The standard interface may include various interface standards, protocols, and/or schemes, such as advanced technology attachment (ATA), serial ATA (SATA), external SATA (e-SATA), small computer small interface (SCSI), serial attached SCSI (SAS), peripheral component interconnection (PCI), PCI express (PCI-E), an IEEE 1394 interface, a universal serial bus (USB) interface, a secure digital (SD) card interface, a multimedia card (MMC) interface, an embedded multi media card (eMMC) interface, a universal flash storage (UFS) interface, and/or a compact flash (CF) card interface, etc., but is not limited thereto.

The non-volatile memory 120 may be a flash memory device including flash memory cells, but is not limited thereto. However, the example embodiments of the inventive concepts are not limited thereto. In the following descriptions of various example embodiments of the inventive concepts, it is assumed that the non-volatile memory 120 is a flash memory device including flash memory cells for the sake of clarity and convenience. A flash memory cell may be referred to as a memory cell.

The non-volatile memory 120 may include at least one memory cell array, etc., but is not limited thereto. The memory cell array may include a plurality of memory cells included and/or disposed in areas where a plurality of word lines intersect with a plurality of bit lines. Memory cells may have multiple threshold voltage distributions (e.g., desired threshold voltage distributions, etc.) according to, corresponding to, and/or based on programmed data. For example, when the memory cell is a single-level cell (hereinafter, SLC) storing one bit per one memory cell, the memory cells may have two threshold voltage distributions according to, corresponding to, and/or based on a program state. As another example, when the memory cell is a multi-level cell (hereinafter, MLC) storing two bits per one memory cell, the memory cells may have four threshold voltage distributions according to, corresponding to, and/or based on a program state. As another example, when the memory cell stores three or more bits per one memory cell, the memory cells may have eight or more threshold voltage distributions according to, corresponding to, and/or based on a program state.

When the non-volatile memory 120 performs a program operation on a plurality of memory cells, a plurality of program loops may be performed, but the example embodiments are not limited thereto. When each program loop is performed, an operation of applying a program voltage to the plurality of memory cells to have a particular program state in each program loop may be performed. In each program loop, an operation of sensing the outputs of the plurality of memory cells may be performed to determine whether the program state has been set, e.g., a data read operation may be performed, etc. Also, in each program loop, an operation of determining whether the program state has passed by using the sensing value may be performed, or in other words, a verification operation (e.g., a data verification operation, etc.) may be performed, etc.

In at least one example embodiment, when each memory cell is an SLC, the threshold voltage distribution may have an erase state and/or a first program state. When a sensing operation is performed on memory cells to be programmed into the first program state, a precharge operation may be selectively performed on (and/or only on) bit lines respectively connected to memory cells to be programmed in the first program state among bit lines respectively connected to the plurality of memory cells.

The memory controller 110 and the non-volatile memory 120 may be integrated into one semiconductor device, but the example embodiments are not limited thereto, and for example, the memory controller 110 may be included in a separate semiconductor device from the non-volatile memory 120, etc. For example, the memory controller 110 and the non-volatile memory 120 may be integrated into a single semiconductor device to constitute, for example, a memory card, etc. For example, the non-volatile memory 120 and the memory controller 110 may be integrated into one semiconductor device to constitute a PC card, a CF card, a smart media card, a memory stick, an MMC, an SD card, and/or a UFS device, etc. As another example, the memory controller 110 and the non-volatile memory 120 may be integrated into one semiconductor device to constitute an SSD, etc.

Figure 2:
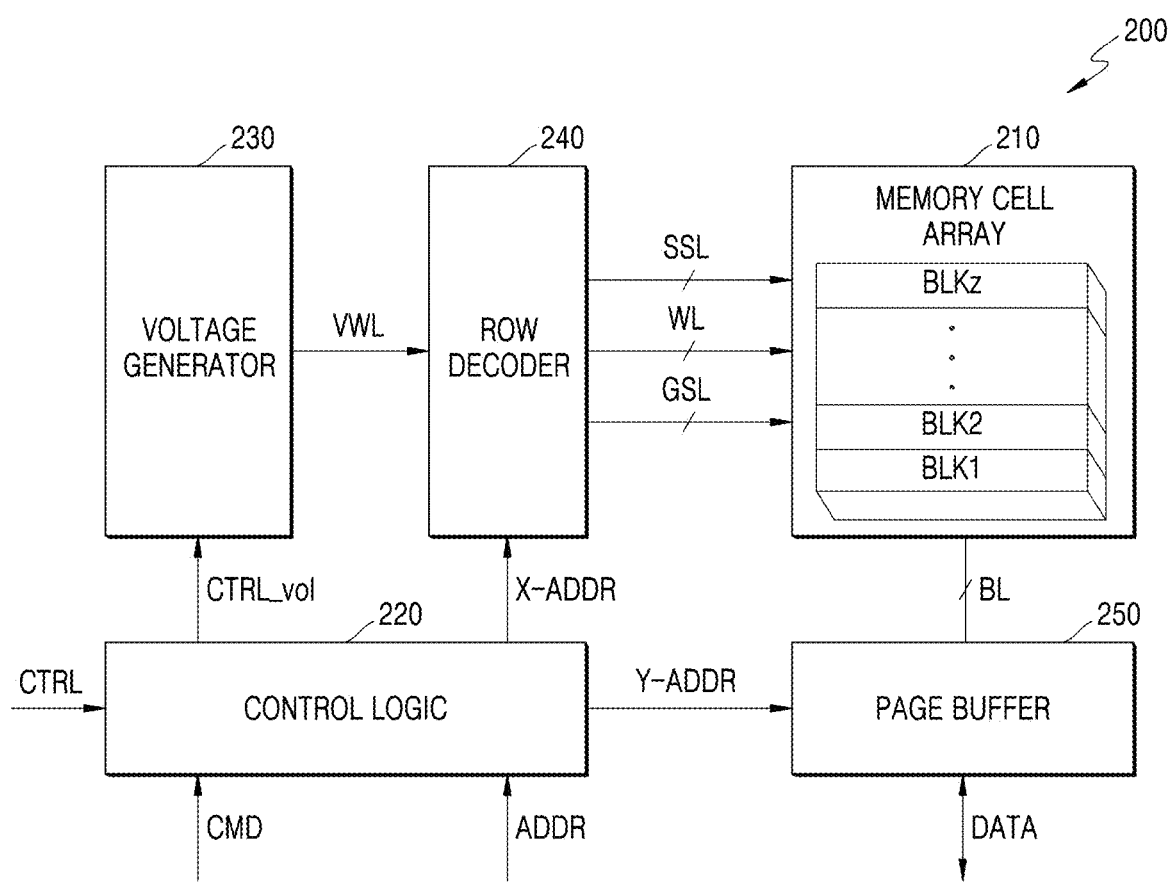
FIG. 2 is a diagram for describing a non-volatile memory according to at least one example embodiment.

FIG. 2 is a diagram for explaining a non-volatile memory 200 according to at least one example embodiment.

Referring to FIG. 2, the non-volatile memory 200 may include a memory cell array 210, a control logic 220, a voltage generator 230, a row decoder 240, and/or a page buffer circuit 250, etc., but the example embodiments are not limited thereto. In at least one example embodiment, the non-volatile memory 200 may further include a data input/output circuit and/or an input/output interface, etc.

The memory cell array 210 includes a plurality of memory cells, and may be connected to word lines WL, string selection lines SSL, ground selection lines GSL, and bit lines BL, etc. For example, the memory cell array 210 may be connected to the row decoder 240 through the word lines WL, the string selection lines SSL, and the ground selection lines GSL, and may be connected to the page buffer circuit 250 through the plurality of bit lines BL, but is not limited thereto.

The memory cell array 210 may include a plurality of blocks (e.g., memory blocks) BLK1 to BLKz. For example, each of the plurality of blocks BLK1 to BLKz may have a three-dimensional structure (or a vertical structure), but the example embodiments are not limited thereto. In detail, each block includes structures (e.g., memory structures, etc.) extending in first to third directions (e.g., the X-direction, the Y-direction, and the Z-direction, etc.). For example, each block includes a plurality of NAND strings (hereinafter, referred to as 'strings') extending in the third direction, but the example embodiments are not limited thereto. In this case, the plurality of strings may be provided to be spaced apart by a desired and/or particular distance in the first and second directions, etc. The blocks BLK1 to BLKz may be selected by the row decoder 240. For example, the row decoder 240 may select at least one block corresponding to at least one block address from among the blocks BLK1 to BLKz.

Each of the memory cells included in the memory cell array 210 may store one or more bits. For example, one or more of the memory cells may be an SLC that stores 1 bit of data. As another example, one or more of the memory cells may be an MLC that stores 2 bits of data. As another example, one or more of the memory cells may be a triple-level cell (hereinafter, TLC) that stores 3-bit data. As another example, one or more of the memory cells may be a quad-level cell (or quadruple-level cell, hereinafter QLC) that stores 4-bit data. However, the example embodiments of the inventive concepts are not limited thereto.

The plurality of memory blocks BLK1 to BLKi may include at least one of a SLC memory block including SLCs, an MLC memory block including MLCs, a TLC memory block including TLCs, and/or a QLC memory block including QLCs, but are not limited thereto. Among the plurality of memory blocks included in the memory cell array 210, some memory blocks may be SLC memory blocks, and other memory blocks may be MLC memory blocks and/or TLC memory blocks, etc.

When an erase voltage is applied to the memory cell array 210, the plurality of memory cells may be put into an erase state, and when a program voltage is applied to the memory cell array 210, the plurality of memory cells may be put into a program state. In this case, each memory cell may have an erase state and at least one program state that are classified according to and/or correspond to a threshold voltage, etc.

The control logic 220 (e.g., control logic circuitry, etc.) may generally control various operations in the non-volatile memory 200, etc. For example, based on the command CMD, the address ADDR, and/or the control signal CTRL received from the memory controller 210, the control logic 220 may output various control signals for writing data DATA to the memory cell array 210 and/or reading data DATA from the memory cell array 210, etc., but is not limited thereto. In at least one example embodiment, when a plurality of memory cells are programmed, the control logic 220 may generally control various operations in the non-volatile memory 200 so that at least one program loop is performed and/or sequentially performed. For example, when the memory cells are SLCs, only the first program loop may be performed, but the example embodiments are not limited thereto. According to some example embodiments, the control logic 220, the voltage generator 230, row decoder 240, and/or the page buffer circuit 250, etc., may be implemented in the processing circuitry. The processing circuitry may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Various control signals output from the control logic 220 may be provided to the voltage generator 230, the row decoder 240, and/or the page buffer circuit 250, etc. The control logic 220 may provide the voltage control signal CTRL_vol to the voltage generator 230. In at least one example embodiment, the control logic 220 may generate and/or transmit a voltage control signal CTRL_vol for controlling generation of a program voltage and/or a verify voltage by the voltage generator 230 to be provided to the memory cell array 210 in a program operation, etc.

In at least one example embodiment, the control logic 220 may control the voltage generator 230 to generate at least one verify voltage and/or at least one program voltage in each program loop, and the control logic 220 may control the voltage generator 230 to generate a program voltage of which a level (e.g., a voltage level, etc.) is changed and/or adjusted as the number of program loops increases. For example, as the number of program loops increases, the control logic 220 may control the voltage generator 230 to generate a program voltage having a level increased by a desired step voltage, etc.

In at least one example embodiment, the control logic 220 may perform a first program loop on the plurality of memory cells. For example, the control logic 220 may control the voltage generator 230 and cause the voltage generator 230 to apply the first program voltage in the first program loop. In addition, the control logic 220 may control the voltage generator 230 and cause the voltage generator 230 to apply the first verify voltage in the first program loop. The control logic 220 may control the page buffer circuit 250 and cause the page buffer circuit 250 to sense a first sensing value corresponding to an output based on the first verify voltage. The control logic 220 may count, calculate, and/or determine the number of on-cells based on the first sensing value. Here, the on-cell may be a memory cell having a lower threshold voltage (e.g., a desired threshold voltage) than the first verify voltage, but the example embodiments are not limited thereto. The on-cell may be referred to as a slow cell. Moreover, the control logic 220 may compare the first count value with at least one pre-stored and/or desired reference value, determine whether the first program state has passed (e.g., whether the first program loop has been successfully verified, etc.), according to the comparison result, and set a second program voltage in a second program loop after the first program loop. A detailed description thereof is described below with reference to FIGS. 9, 10, and 12. At least one reference value may be stored in the control logic 220 by using an eFuse method, but the example embodiments are not limited thereto.

The voltage generator 230 may be connected to the memory cell array 210 through a plurality of word lines WL. The voltage generator 230 may generate various types and/or levels of voltages to perform program, read, and/or erase, etc., operations on the memory cell array 210, based on the voltage control signal CTRL_vol. The voltage generator 230 may generate a word line voltage VWL, for example, a program voltage, a verify voltage, and the like, and may transmit the word line voltage VWL to the row decoder 240.

In at least one example embodiment, the voltage generator 230 may generate a program voltage and/or a verify voltage of which a level (e.g., a voltage level) is changed and/or adjusted as the number of program loops increases based on the voltage control signal CTRL_vol. When the program loop is performed, the programming method according to at least one example embodiment may be performed in an incremental step pulse programming (ISPP) method, and the voltage generator 230 may generate a program voltage of which a voltage level is increased by a step voltage (e.g., a desired voltage amount, a desired voltage increase, etc.) from a previous program voltage whenever a program loop is performed.

In at least one example embodiment, the voltage generator 230 may generate a second program voltage during the second program loop that is set based on a first count value sensed in the first program loop, but is not limited thereto.

The program voltage, verify voltage, and the like, generated by the voltage generator 230 may be provided to at least one selected word line among the plurality of word lines WL. The selected word line may be at least one word line selected based on the row address X-ADDR received from the control logic 220.

The row decoder 240 may select a particular word line from among the word lines WL, in response to the row address X-ADDR received from the control logic 220. For example, during a program operation, the row decoder 240 may provide a program voltage to the selected word line. Also, the row decoder 240 may select some string selection lines from among the string selection lines SSL and/or some ground selection lines from among the ground selection lines GSL, in response to the row address X-ADDR received from the control logic 220.

The page buffer circuit 250 may be connected to the memory cell array 210 through a plurality of bit lines BL. The page buffer circuit 250 may select some bit lines from among the plurality of bit lines BL, in response to the column address Y-ADDR received from the control logic 220. During a program operation and/or a read operation, the page buffer circuit 250 may operate as a sense amplifier to sense data DATA stored in the memory cell array 210. During a program operation, the page buffer circuit 250 may operate as a write driver to input data DATA to be stored in the memory cell array 210.

The page buffer circuit 250 may store data DATA read from the memory cell array 210 and/or data DATA to be written into the memory cell array 210. The page buffer circuit 250 may sense a first sensing value corresponding to an output based on the verify voltage under control of the control logic 220. When the verify voltage is applied, the page buffer circuit 250 may store and/or temporarily store the first sensing value. The stored sensing value may be a count value corresponding to the number of on-cells, e.g., the number of memory cells which have been turned on and/or have a value corresponding to a logic "1" value stored in them.

When the row decoder 240 applies a program voltage to the selected word line during a program operation, the page buffer circuit 250 may apply a program inhibit voltage and a bit line voltage, such as a program voltage, to the plurality of bit lines BL, according to and/or based on the speed at which the memory cell is programmed, etc.

The page buffer circuit 250 may include a plurality of page buffers respectively connected to the plurality of bit lines BL. A plurality of page buffers may respectively correspond to bit lines, and each page buffer may include a plurality of latches, but are not limited thereto. Hereinafter, it will be defined that a page buffer circuit includes a page buffer connected to each bit line. However, the example embodiments of the inventive concepts are not limited thereto, and the term may be defined differently, for example, a unit of configuration in which one page buffer corresponds to a plurality of bit lines may be defined as a page buffer unit, etc.

Figure 3:
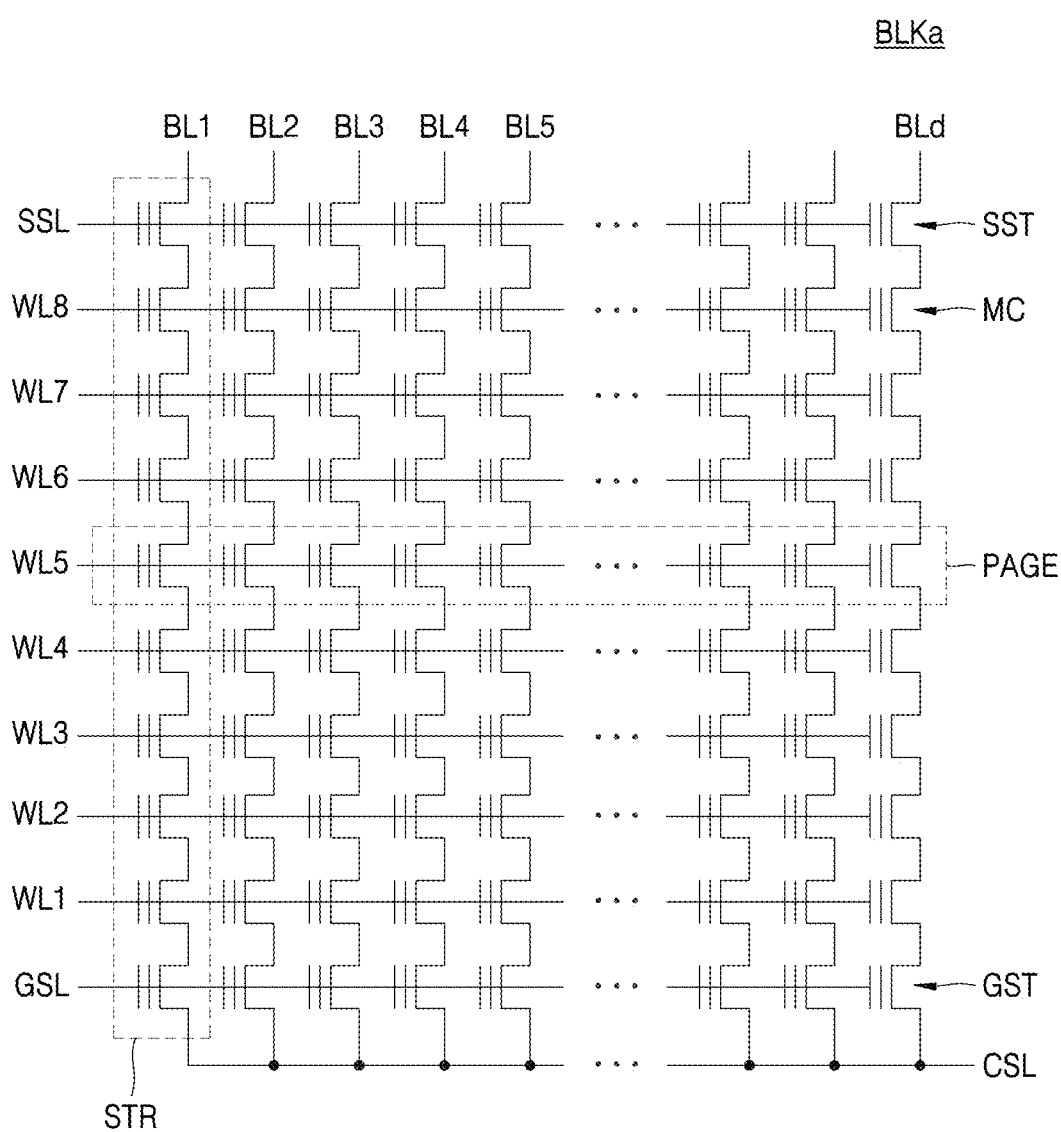
FIG. 3 is a circuit diagram illustrating a memory block according to at least one example embodiment.

FIG. 3 is a circuit diagram illustrating a memory block according to at least one example embodiment.

Referring to FIG. 3, a memory block BLKa may be a NAND flash memory having a horizontal structure, but the example embodiments are not limited thereto. The memory block BLKa may include, for example, d (where d is an integer greater than or equal to 2) strings STR, in which eight memory cells are serially connected, but the example embodiments are not limited thereto, and for example, there may be a greater or lesser number of memory cells connected to the strings STR, etc. Each string STR may include a string select transistor SST and/or a ground select transistor GST respectively connected to both ends of the serially connected memory cells MC, etc. Here, the number of strings STR, the number of word lines WL, and/or the number of bit lines BL, etc., may be variously changed according to the example embodiments.

In the NAND flash memory including the memory block having the structure shown in FIG. 3, an erase operation is performed in units of memory blocks, and a program may be performed in units of pages respectively corresponding to, for example, the word lines WL1 to WL8, etc. In one example embodiment, when the memory cell MC is an SLC, one page PAGE may correspond to one word line. In another example embodiment, when the memory cell MC is an MLC, a TLC, or a QLC, a plurality of pages PAGE may correspond to one word line. For example, when the memory cell MC is a QLC, each word line may correspond to a plurality of pages, e.g., an LSB page, an ESB page, a USB page, and an MSB page, but the example embodiments are not limited thereto.

In at least one example embodiment, the first program voltage in the first program loop may be set differently for and/or according to each of the plurality of word lines, e.g., WL1 to WL8, etc. For example, the magnitude (and/or voltage level) of the first program voltage to be applied to the first word line WL1 may be different from the magnitude (and/or voltage level) of the first program voltage to be applied to the second word line WL2, etc. Setting different first program voltages in the first program loop for each word line may be referred to as an individual die core (IDC). This operation may be performed by the control logic 220 illustrated in FIG. 2, but the example embodiments are not limited thereto.

In at least one example embodiment, the IDC may be set differently according to the non-volatile memory 200 shown in FIG. 2. That is, the first program voltage in the first program loop may be set differently according to the non-volatile memory, etc.

Figure 4:
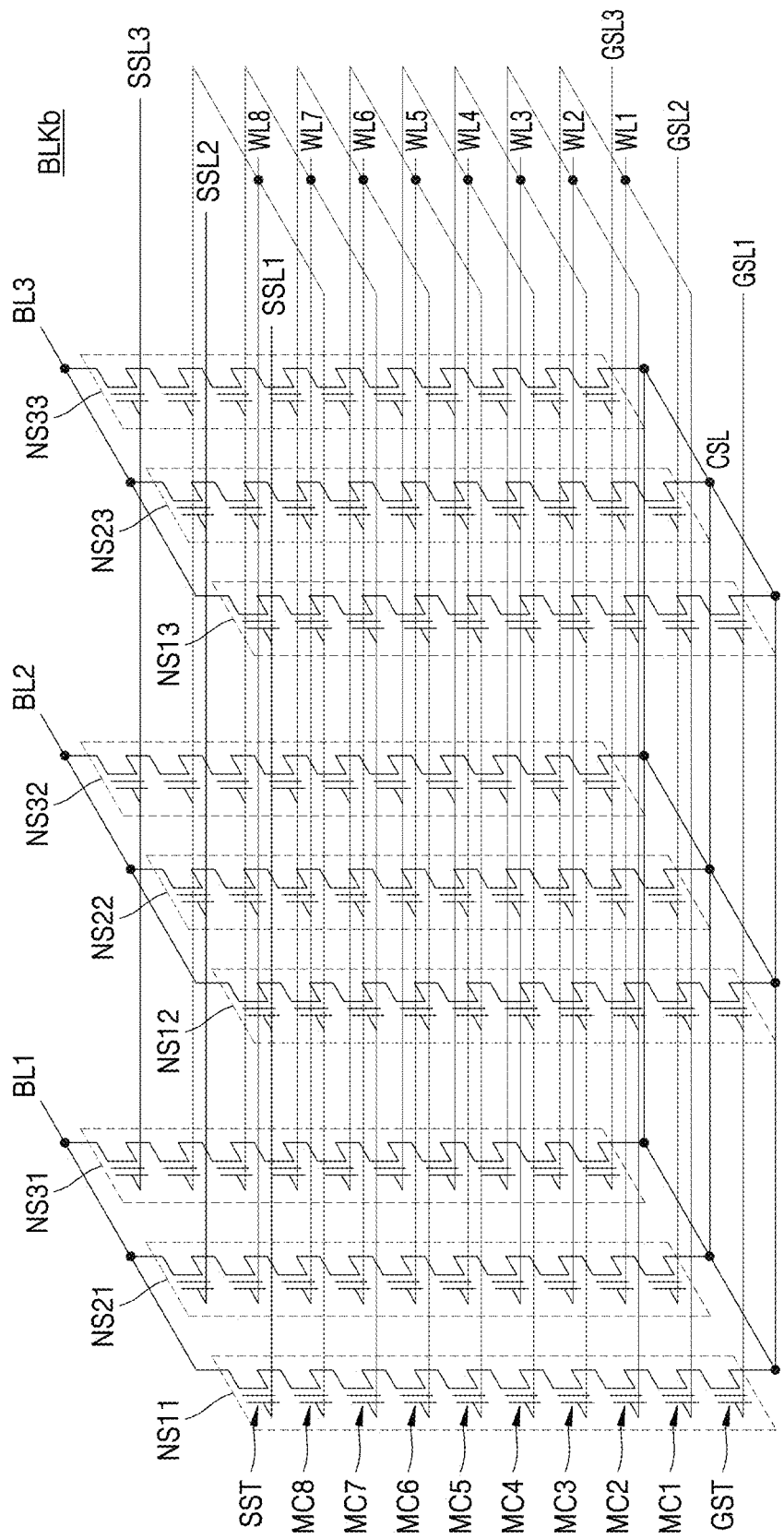
FIG. 4 is a circuit diagram illustrating a memory block according to at least one example embodiment.

FIG. 4 is a circuit diagram illustrating a memory block according to at least one example embodiment.

Referring to FIG. 4, a memory block BLKb may be a NAND flash memory having a vertical structure, but the example embodiments are not limited thereto. The memory block BLKb may include a plurality of NAND strings NS11 to NS33, a plurality of word lines WL1 to WL8, a plurality of bit lines BL1 to BL3, ground selection lines GSL1, GSL2, and GSL3, a plurality of string selection lines SSL1 to SSL3, and/or a common source line CSL, etc. Here, the number of NAND strings, the number of word lines, the number of bit lines, the number of ground selection lines, and the number of string selection lines may be variously changed according to the example embodiments.

NAND strings NS11, NS21, and NS31 may be provided between the first bit line BL1 and the common source line CSL, NAND strings NS12, NS22, and NS32 may be provided between the second bit line BL2 and the common source line CSL, and NAND strings NS13, NS23, and/or NS33 may be provided between the third bit line BL3 and the common source line CSL, etc. Each NAND string (e.g., NS11) may include a string select transistor SST, a plurality of memory cells MC1 to MC8, and/or a ground select transistor GST, etc., connected in series. Hereinafter, the NAND string is referred to as a string for convenience.

Strings commonly connected to one bit line constitute one column. For example, the NAND strings NS11, NS21, and NS31 commonly connected to the first bit line BL1 may correspond to the first column, the NAND strings NS12, NS22, and NS32 commonly connected to the second bit line BL2 may correspond to the second column, and the NAND strings NS13, NS23, and NS33 commonly connected to the third bit line BL3 may correspond to the third column, etc.

Strings connected to one string selection line constitute one row. For example, the NAND strings NS11, NS12, and NS13 connected to the first string selection line SSL1 may correspond to the first row, the NAND strings NS21, NS22, and NS23 connected to the second string selection line SSL2 may correspond to the second row, and the NAND strings NS31, NS32, and NS33 connected to the third string selection line SSL3 may correspond to the third row, etc.

The string select transistor SST is connected to the plurality of string selection lines, e.g., string selection lines SSL1 to SSL3, etc. The plurality of memory cells, e.g., MC1 to MC8, etc., are respectively connected to their corresponding word lines, e.g., word lines WL1 to WL8, etc. The ground select transistor GST is connected to the plurality of ground selection lines, e.g., GSL1, GSL2, and GSL3, etc. The string select transistor SST is connected to its corresponding bit line BL, and the ground select transistor GST is connected to the common source line CSL.

Word lines of the same height (e.g., WL1) are connected in common, and string selection lines SSL1 to SSL3 are separated from each other, but the example embodiments are not limited thereto. For example, when programming memory cells connected to the first word line WL1 and included in the NAND strings NS11, NS12, and NS13, the first word line WL1 and the first string selection line SSL1 may be selected. In at least one example embodiment, as shown in FIG. 4, the ground selection lines GSL1, GSL2, and GSL3 may be separated from each other. In at least one example embodiment, the ground selection lines GSL1, GSL2, and GSL3 may be connected to each other.

In at least one example embodiment, the first program voltage in the first program loop may be set differently according to each of the word lines WL1 to WL8. In at least one example embodiment, the first program voltage in the first program loop may be set differently according to the non-volatile memory 200 illustrated in FIG. 2.

Figure 5:
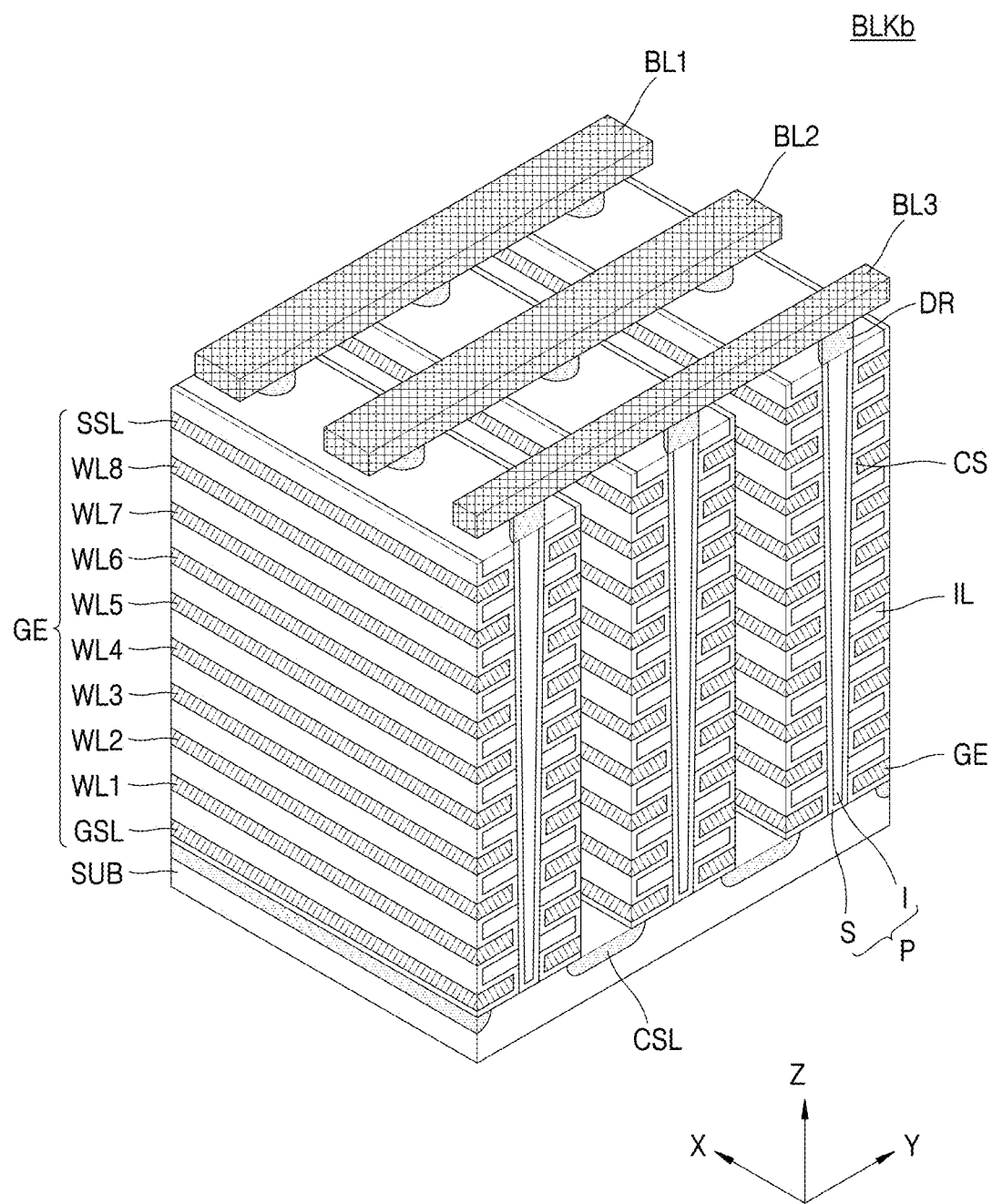
FIG. 5 is a perspective view illustrating a memory block according to the circuit diagram of FIG. 4.

FIG. 5 is a perspective view illustrating a memory block according to the circuit diagram of FIG. 4 according to some example embodiments-.

Referring to FIG. 5, a memory block BLKb is formed in a direction perpendicular to a substrate SUB, or in other words, a vertical direction, but the example embodiments are not limited thereto. The substrate SUB has a first conductivity type (e.g., p-type), and a common source line CSL extending in a first direction (e.g., the x-direction), and may be doped with impurities of a second conductivity type (e.g., n-type), but the example embodiments are not limited thereto. The common source line CSL may function as a source area for supplying current to the vertical memory cells, but is not limited thereto. In the area of the substrate SUB between two adjacent common source lines CSL, a plurality of insulating films IL extending in the second direction (e.g., the y-direction) are sequentially provided in the third direction (e.g., the z-direction), and the plurality of insulating films IL are spaced apart from each other by a particular and/or desired distance in the third direction, but the example embodiments are not limited thereto. For example, the plurality of insulating films IL may include an insulating material, such as silicon oxide, etc.

In the area of the substrate SUB between two adjacent common source lines CSL, a channel hole may be sequentially included and/or disposed in the first direction and may penetrate the plurality of insulating films IL in the third direction. The channel hole may be formed in a cup shape (and/or a cylinder shape with a closed bottom) extending in a vertical direction, but the example embodiments are not limited thereto, and for example, the channel hole may be formed in a different shape, etc. Additionally, the channel hole may be formed in a pillar shape as shown in the drawing, etc. Hereinafter, the channel holes will be referred to as pillars. The plurality of pillars P may penetrate the plurality of insulating films IL and contact the substrate SUB. For example, a surface layer S of each pillar P may include the first type of silicon material and function as a channel area, but the example embodiments are not limited thereto. In addition, the inner layer I of each pillar P may include an insulating material, such as silicon oxide, etc., and/or an air gap.

In an area between two adjacent common source lines CSL, a charge storage layer CS is provided along exposed surfaces of the insulating films IL, the pillars P, and/or the substrate SUB, etc. For example, the charge storage layer CS may have an oxide-nitride-oxide (ONO) structure, but the example embodiments are not limited thereto. Also, in an area between two adjacent common source lines CSL, a gate electrode GE may be provided on an exposed surface of the charge storage layer CS, but is not limited thereto.

A plurality of drains and/or drain contacts DR are provided on the plurality of pillars P, respectively. For example, the drains and/or drain contacts DR may include a silicon material doped with impurities having the second conductivity type, but are not limited thereto. According to some example embodiments, the bit lines BL extending in the second direction (e.g., the y-direction) and spaced apart by a particular and/or desired distance in the first direction may be provided on the drains and/or drain contacts DR. At least one example embodiment of the memory block has been described with reference to FIG. 4. However, the example embodiments of the inventive concepts are not limited thereto, and the structure of the memory block may be variously modified.

Figure 6:
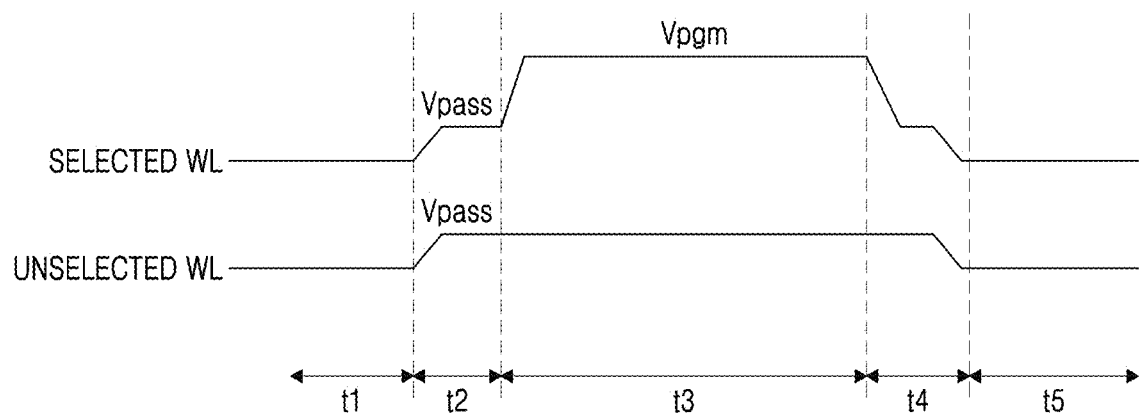
FIG. 6 is a timing diagram illustrating a method of applying a program voltage in a program operation according to at least one example embodiment.

FIG. 6 is a timing diagram illustrating a method of applying a program voltage in a program operation, according to at least one example embodiment.

Referring to FIG. 6, an initialization voltage may be applied to each of the word lines in a first period t1. For example, an initialization voltage may be applied to each of the selected word lines SELECTED WL and the unselected word line UNSELECTED WL. However, the example embodiments of the inventive concepts are not limited thereto.

In the second period t2, the pass voltage Vpass may be applied to the selected word line SELECTED WL and the unselected word lines UNSELECTED WL. The selected word line SELECTED WL and the unselected word lines UNSELECTED WL may be turned on by the pass voltage Vpass.

In the third period t3, the program voltage Vpgm may be applied to the selected word line SELECTED WL, or in other words, the voltage applied to the selected word line SELECTED WL may be increased to the program voltage Vpgm, and the pass voltage Vpass may continue to be applied to the unselected word lines UNSELECTED WL.

In the fourth period t4, the pass voltage Vpass may be applied to the selected word line SELECTED WL and the unselected word lines UNSELECTED WL, or in other words, the voltage applied to the selected word line SELECTED WL may be reduced to the pass voltage Vpass level, while the voltage applied to the unselected word lines UNSELECTED WL may continue to be the pass voltage Vpass.

In the fifth period t5, the initialization voltage may be applied to the selected word line SELECTED WL and the unselected word lines UNSELECTED WL, or in other words, the voltages applied to the SELECTED WL and the unselected word lines UNSELECTED WL may be reduced to the initialization voltage level, etc.

Figure 7:
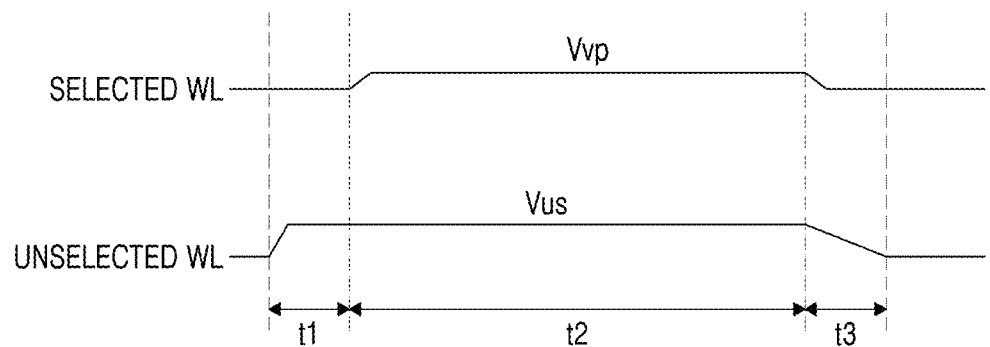
FIG. 7 is a timing diagram for explaining a method of applying a verify voltage in a program operation, according to at least one example embodiment.

FIG. 7 is a timing diagram for explaining a method of applying a verify voltage in a program operation, according to at least one example embodiment.

In the first period t1, the unselected read voltage Vus may be applied to the unselected word lines UNSELECTED WL. An initialization voltage may be applied to the selected word line SELECTED WL.

In the second period t2, a verify voltage Vvp may be applied to the selected word line SELECTED WL, or in other words, the voltage applied to the selected word line SELECTED WL may be increased to the voltage level of the verify voltage Vvp.

In the third period t3, the initialization voltage may be applied to the selected word line SELECTED WL and the unselected word lines UNSELECTED WL. In other words, the voltage applied to the selected word line SELECTED WL may be reduced to the voltage level of the initialization voltage, and the voltage applied to the unselected word lines UNSELECTED WL may be maintained.

Figure 8A:
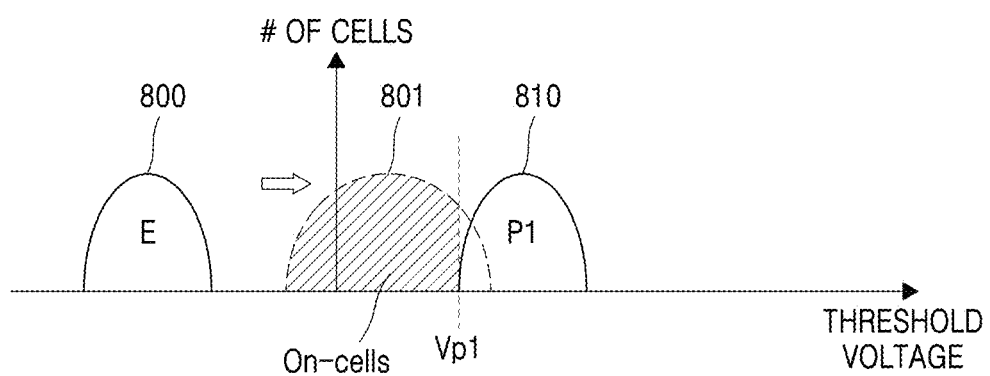
FIGS. 8A, 8B, and 8C are diagrams illustrating, as an example, distributions of threshold voltages of memory cells according to some example embodiments of the inventive concepts.
Figure 8B:
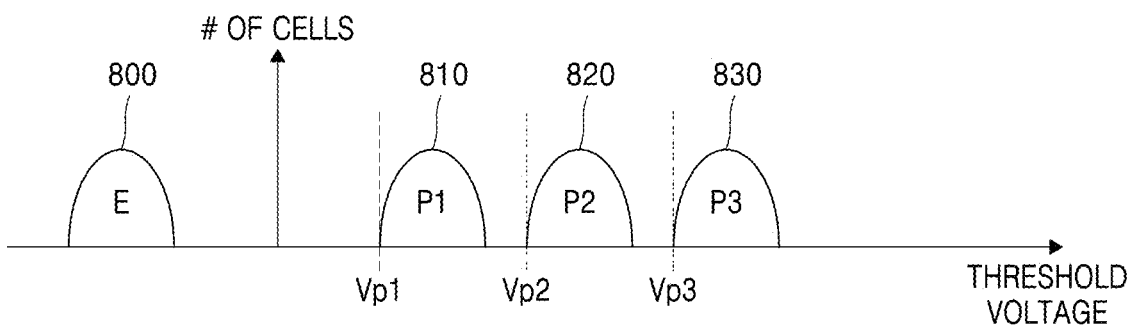
Figure 8C:
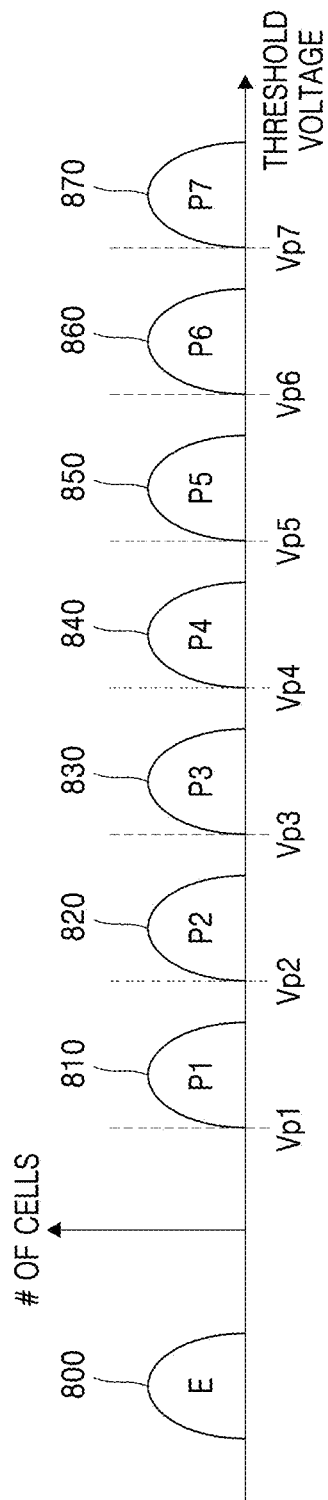

FIGS. 8A, 8B, and 8C are diagrams illustrating, as an example, distributions of threshold voltages of memory cells according to some example embodiments of the inventive concepts. In detail, FIG. 8A is a diagram illustrating a threshold voltage distribution of an SLC according to at least one example embodiment, FIG. 8B is a diagram illustrating a threshold voltage distribution of an MLC according to at least one example embodiment, and FIG. 8C is a diagram illustrating a threshold voltage distribution of a TLC according to at least one example embodiment.

Referring to FIG. 8A, when a program operation is performed on the SLC, the SLCs may have various (e.g., a plurality of different) threshold voltage distributions, such as threshold voltage distributions 800, 801, and/or 810, etc., but the example embodiments are not limited thereto. That is, the SLCs may have a threshold voltage distribution belonging to a threshold voltage distribution corresponding to any one of the erase state E and/or the first program state P1. For example, before the program operation is performed, the SLCs may have a threshold voltage distribution 800 corresponding to the erase state E. During a program operation, the SLCs may have the threshold voltage distribution 801. In the second threshold voltage distribution 801, when the first voltage Vp1 is applied as a verify voltage (e.g., if the first voltage Vp1 corresponds to the voltage level of a verify voltage, etc.), a current may flow into the SLCs having a threshold voltage lower than or equal to the first voltage Vp1 and no current may flow into the SLCs having a threshold voltage higher than the first voltage Vp1. As such, when the first voltage Vp1 is the verify voltage, SLCs having a threshold voltage lower than or equal to the verify voltage may be referred to as on-cells, and SLCs having a threshold voltage higher than the verify voltage may be referred to as and/or determined to be off-cells. The first program state P1 may be a state of the SLCs after a program operation (e.g., a write operation) is performed. When the program operation is completed, the SLCs may have the threshold voltage distribution 810 corresponding to the first program state P1.

Referring to FIG. 8B, when a program operation is performed on the MLC, the MLCs may have a threshold voltage belonging to a plurality of threshold voltage distribution, such as voltage distributions 800, 810, 820, and/or 830, etc., corresponding to one of the erase state E and the first to third program states P1, P2, and P3, etc., but the example embodiments are not limited thereto. As the operation of applying the program voltage proceeds, a verification operation for each of the first to third program states P1, P2, and P3 may be sequentially performed from the first program state P1 to the third program state P3, but the example embodiments are not limited thereto. The verification of the first program state P1 may be determined by a verification operation of determining whether the stored voltages and/or threshold voltages of the selected MLCs reach a threshold voltage corresponding to the first program state P1. The first voltage Vp1 may be used, for example, as a verify voltage for verifying that the MLCs have and/or store a voltage level corresponding to the threshold voltage distribution 810 corresponding to the first program state P1. Among the MLCs to be programmed (e.g., the MLC cells selected to be programmed) into the first program state P1, MLCs having a voltage higher than the first voltage Vp1 may be considered and/or determined to be off-cells. Among the memory cells to be programmed into the first program state P1, memory cells that are lower than or equal to the first voltage Vp1 may be considered and/or determined to be on-cells. The verification for each of the second and/or third program states P2 and/or P3 may be an operation of determining whether threshold voltages corresponding to the second and/or third program states P2 and/or P3, respectively, for example, the second and/or third voltages Vp2 and/or Vp3, respectively, have been reached.

Referring to FIG. 8C, when a program operation is performed on the TLC, the TLC may have a threshold voltage belonging to the plurality of threshold voltage distribution 800, 810, 820, 830, 840, 850, 860, and/or 870, etc., corresponding to one of the erase state E and the first to seventh program states P1, P2, P3, P4, P5, P6, and/or P7, etc., but the example embodiments are not limited thereto. As the operation of applying the program voltage proceeds, a verification operation for each of the first to seventh program states P1, P2, P3, P4, P5, P6, and/or P7, etc., may be sequentially performed. Each of the first to seventh voltages Vp1, Vp2, Vp3, Vp4, Vp5, Vp6, and/or Vp7, etc., may be used as a verify voltage for verifying TLCs having a plurality of threshold voltage distribution 810, 820, 830, 840, 850, 860, and/or 870, etc., corresponding to each of the first to seventh program states P1, P2, P3, P4, P5, P6, and P7, for example, but the example embodiments are not limited thereto.

Figure 9:
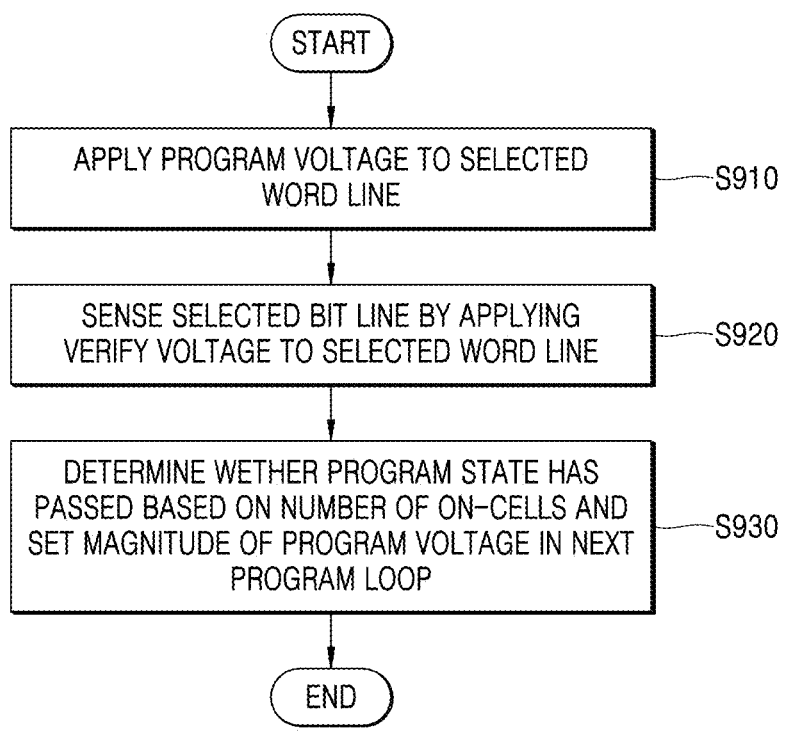
FIG. 9 is a flowchart illustrating a program operation method in a first program loop according to at least one example embodiment.

FIG. 9 is a flowchart illustrating a program operation method in a first program loop according to at least one example embodiment.

Referring to FIG. 9, in operation S910, a program voltage is applied to a selected word line. In detail, the control logic 220 sets a first program voltage (e.g., a first program voltage level to be applied) in the first program loop, and the voltage generator 230 generates and applies the first program voltage to the selected word line in response to an instruction and/or control from the control logic 220, etc. Operation S910 may be referred to as a program operation.

In operation S920, a verify voltage is applied to the selected word line, and the selected bit line is sensed. That is, after the first program voltage is applied in the first program loop, the first sensing value is sensed. Here, the first sensing value may correspond to an output based on the first verify voltage set in the first program loop. In detail, the control logic 220 sets a first verify voltage (e.g., a first verify voltage level to be applied) in the first program loop, the voltage generator 230 generates and applies the first verify voltage to the selected word line in response to an instruction and/or control from the control logic 220, and the page buffer circuit 250 senses the first sensing value through the selected bit line. Operation S920 may be referred to as a verification operation.

In operation S930, based on the number of on-cells, the control logic 220 determines whether the program state has passed, and the magnitude (and/or voltage level) of the program voltage in the next program loop (e.g., the second program loop) is set. In detail, the control logic 220 counts the number of on-cells based on the first sensing value, compares the first count value with the at least one reference value, determines whether the first program state has passed according to the comparison result (e.g., determines whether the first program state has been successfully verified based on the results of the comparison, etc.), and sets the second program voltage based on the results of the verification of the first program state, etc. Operation S930 may be referred to as a pass confirmation operation.

As described above, by completing the program operation early and/or faster than the conventional program operation, the performance of the program operation and the non-volatile memory device may be increased.

Figure 10:
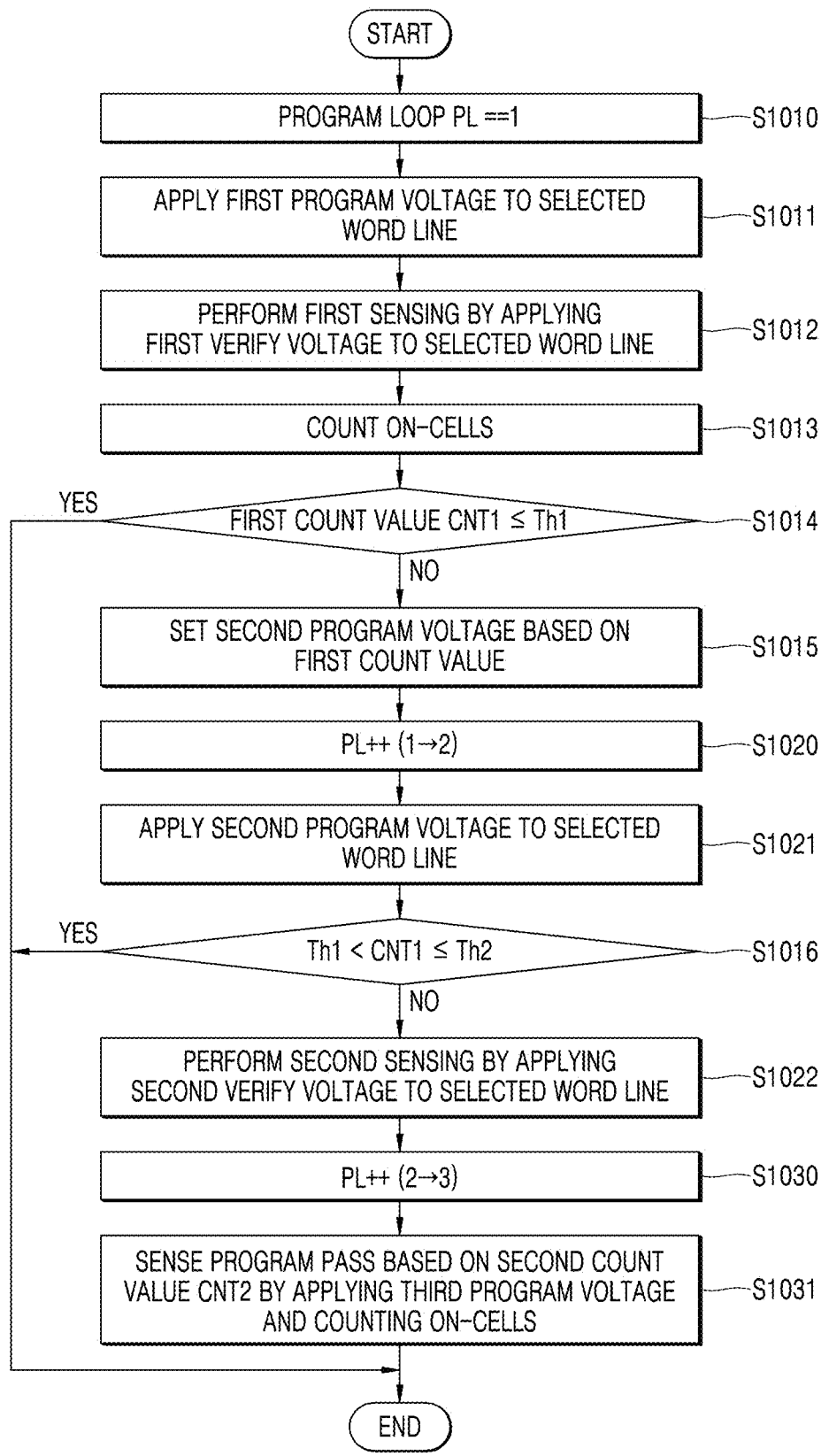
FIG. 10 is a flowchart of a program operation method in detail according to at least one example embodiment.

FIG. 10 is a flowchart of a program operation method according to at least one example embodiment. It is assumed that the program operation method according to FIG. 10 is performed on an SLC.

Referring to FIG. 10, in operation S1010, a program loop PL is set to 1 (e.g., the control logic 220 initializes the program loop to an initialization value, such as 1, etc.). In operation S1011, a first program voltage is applied to the selected word line by the control logic 220 and the voltage generator 230, etc. In operation S1012, a first verify voltage is applied to the selected word line and a first sensing operation is performed by the control logic 220, the voltage generator 230, and the page buffer circuit 250, etc. The first sensing operation may be an operation in which the page buffer circuit 250 senses a first sensing value based on the first verify voltage. In operation S1013, on-cells are counted by the control logic 220. In detail, the control logic 220 may obtain a count value corresponding to the number of on-cells based on the results of the first verify operation. In operation S1014, the control logic 220 may determine whether the first count value (hereinafter, CNT1) is equal to or less than a first reference value (hereinafter, Th1). In detail, the control logic 220 determines whether CNT1 is equal to or less than Th1. If CNT1 is equal to or less than Th1 (S1014, Yes), the control logic 220 determines that the verification of the first program state of the selected word line is a pass, ends the first program loop, and completes the program operation. In this case, since the control logic 220 determines that the first program state has passed (e.g., completed successfully), the execution of the second program loop may be omitted. Accordingly, the control logic 220 may omit setting the second program voltage. If CNT1 is greater than Th1 (S1014, NO), in operation S1015, a second program voltage is set by the control logic 220 based on CNT1. When CNT1 is greater than Th1, there are a relatively large number of on-cells, and a threshold voltage distribution corresponding to the first program state may not be generated. In this case, the control logic 220 may determine the first program state of the selected word line to be a fail, and the control logic 220 may set the magnitude of the second program voltage (and/or the increase amount of the program voltage) based on CNT1, etc. In at least one example embodiment, the second program voltage may be equal to the sum of the increase amount of the program voltage and the first program voltage, but the example embodiments are not limited thereto, and for example, the second program voltage may be a greater or lesser amount. Operations S1010 to S1014 may be included in the first program loop, but the example embodiments are not limited thereto. As described below, since the control logic 220 may determine whether CNT1 is included between Th1 and a second reference value (hereinafter, Th2) or whether CNT1 is greater than or equal to Th2, operation S1016 may also be included in the first program loop, but the example embodiments are not limited thereto. Th2 may be greater than Th1, but is not limited thereto.

In operation S1020, the control logic 220 increments and/or sets the program loop PL from 1 to 2 for the second program loop, e.g., the next program loop after the first program loop is performed. In operation S1021, the control logic 220 controls and/or instructs the voltage generator 230 to apply a second program voltage to the selected word line. In detail, the control logic 220 may control the voltage generator 230 to apply the second program voltage by performing a second program loop, etc. The voltage generator 230 applies the second program voltage to the selected word line. Because the second program voltage is appropriately set, it may be expected that the SLC reaches the first program state based on the application of the second program voltage. Operation S1021 may be referred to as a program operation and/or write operation, etc. In operation S1016, the control logic 220 determine whether CNT1 is greater than Th1 and less than or equal to Th2. In at least one example embodiment, operation S1016 may be an operation performed together with operation S1014, but the example embodiments are not limited thereto. If CNT1 is greater than Th1 and less than or equal to Th2 (S1016, Yes), the control logic 220 determines that the first program state of the selected word line is a pass (e.g., the first program state of the selected word line has been successfully verified, etc.), and ends the program operation. If CNT1 is greater than Th2 (S1016, NO), in operation S1022, the control logic 220 may cause a second verify voltage to be applied to the selected word line and may cause a second sensing operation to be performed. The second verify voltage may be a verify voltage set in the second program loop by the control logic 220, etc. In at least one example embodiment, the second verify voltage may be the same as the first verify voltage, but is not limited thereto. The second sensing operation may be an operation in which the page buffer circuit 250 senses a second sensing value based on the second verify voltage following the control and/or instructions from the control logic 220, etc. Operation S1022 may be referred to as a verification operation. Operations S1020, S1021, and S1022 may be included in the second program loop, but is not limited thereto.

In operation S1030, the control logic 220 sets and/or increments the program loop PL value from 2 to 3. That is, the third program loop is the next program loop after the second program loop is performed. In operation S1031, the control logic 220 causes and/or instructs the voltage generator 230 to apply a third program voltage to the selected word line, and the control logic 220 determines whether the program pass is detected based on a second count value (hereinafter, CNT2) during which the number of on-cells are counted. In detail, the control logic 220 sets the third program voltage higher than the second program voltage, but is not limited thereto. In at least one example embodiment, the control logic 220 may set a value obtained by adding the magnitude of the second program voltage to the desired and/or preset increment according to ISPP as the magnitude of the third program voltage, but the example embodiments are not limited thereto. The voltage generator 230 applies the third program voltage to the selected word line based on an instruction and/or the control of the control logic 220, etc. The control logic 220 acquires CNT2 based on the second sensing value sensed in the second program loop, compares CNT2 with Th1 and Th2, and detects and/or determines whether the program passes for the first program state (e.g., verifies whether the first program state has been successfully completed, etc.). If CNT2 is equal to or less than Th1, the control logic 220 may determine that the first program state has passed. When the first program state has passed, the program operation may be completed. In at least one example embodiment, the operation of applying the third program voltage to the selected word line and the operation of determining whether to pass the program based on CNT2 may be performed together, but the example embodiments are not limited thereto. Operations S1030 and S1031 may be included in the third program loop.

In at least one example embodiment, the determination operation in operations S1014 and S1016 may be an operation of comparing CNT1 with a plurality of reference ranges composed of Th1 and Th2 with each other, but is not limited thereto. The plurality of reference ranges including Th1 and Th2 may include, for example, first to third reference ranges, but the example embodiments are not limited thereto. The first reference range may be 0 or more and less than or equal to Th1, the second reference range may be greater than Th1 and less than or equal to Th2, and the third reference range may be a range greater than Th2, etc. However, the example embodiments of the inventive concepts are not limited thereto and other reference range values may be used and/or a different number of reference ranges may be used. Additionally, if CNT1 is in the first reference range of Th1 or less, the control logic 220 may determine that the first program state is a pass, omit setting the second program voltage, terminate the first program loop, and complete the program operation. In another example, if CNT1 is in the third reference range being greater than Th2, the control logic 220 may control the voltage generator 230 to execute the third program loop, set the third program voltage to apply the third program voltage, determine that the first program state is a pass, end the third program loop, and complete the program operation. In another example, if CNT1 is in the second reference range between Th1 and Th2, the control logic 220 may control the voltage generator 230 to execute the second program loop, set the second program voltage, apply the second program voltage, determine that the first program state is a pass, end the second program loop, and complete the program operation. When the first program state has passed, the third program loop is terminated (e.g., not performed) and the program operation is completed.

As described above, the program operation for the SLC may be completed in the first program loop, and thus, the speed of the programming operation may be improved and the efficiency and power consumption of the non-volatile memory device may be improved.

Figure 11:
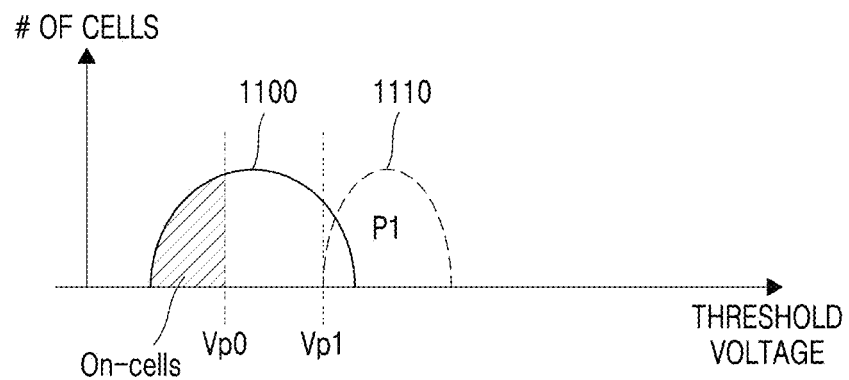
FIG. 11 is a diagram for explaining a method of counting on-cells, according to at least one example embodiment.

FIG. 11 is a diagram for explaining a method of counting on-cells, according to at least one example embodiment.

Referring to FIG. 11, a threshold voltage distribution 1110 higher than the first voltage Vp1 may correspond to the first program state P1. In at least one example embodiment, a voltage Vp0 lower than the first voltage Vp1 may be used as the verify voltage, but the example embodiments are not limited thereto. In this case, with respect to the threshold voltage distribution 1100 generated as the program voltage is applied, memory cells having a threshold voltage lower than the voltage Vp0 may be sensed as and/or considered to be on-cells. As described above, the program voltage in the second program loop may be more accurately set by using the voltage Vp0 lower than the first voltage Vp1, but the example embodiments are not limited thereto.

Figure 12:
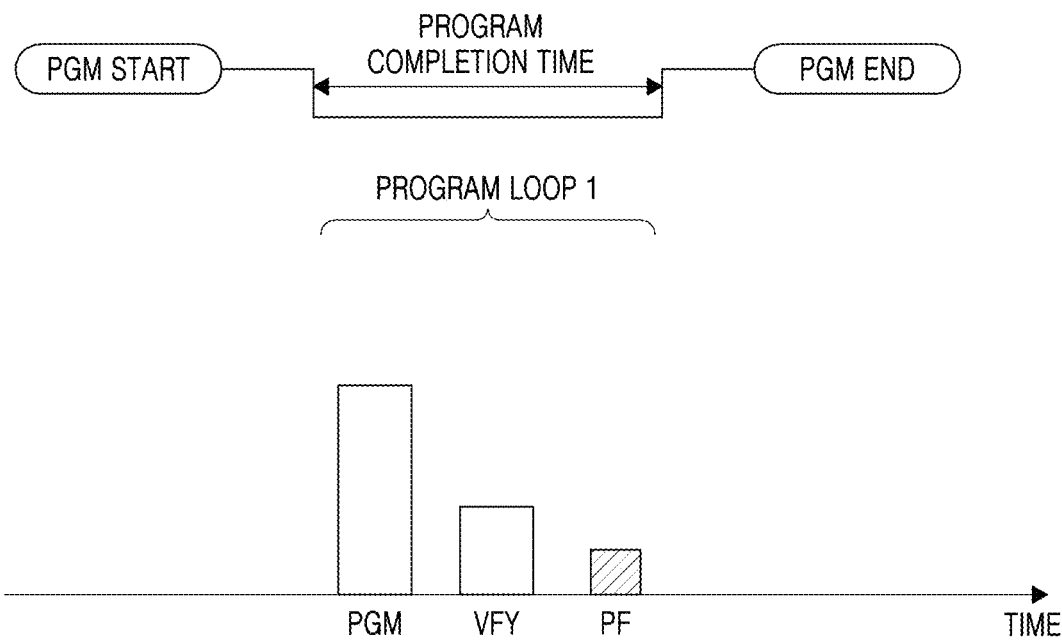
FIG. 12 is a diagram for explaining at least one example embodiment of a method of operating a program for a single-level cell.

FIG. 12 is a diagram for explaining a method of operating a program for a SLC according to at least one example embodiment. In detail, FIG. 12 illustrates an example program operation method when the first count value obtained in the first program loop 1 is equal to or less than the first reference value, but the example embodiments are not limited thereto.

Referring to FIGS. 1 and 10 to 12, the non-volatile memory 120 may start a program operation in response to the control of and/or receiving an instruction from the memory controller 110 (PGM START).

In the first program loop Program loop 1, a program operation PGM, a verification operation VFY, and/or a pass check operation PF may be performed and/or sequentially performed. In program operation PGM, the memory controller 110 may apply the first program voltage to the selected word line (e.g., selected memory cells) of the non-volatile memory 120, and the first program voltage may be differently set by the memory controller 110 according to and/or based on characteristics of the non-volatile memory 120 and/or a selected word line among a plurality of word lines WL included in the non-volatile memory 120, but the example embodiments are not limited thereto. In the verification operation VFY, the memory controller may instruct and/or cause a verify voltage to be applied to the selected word line of the non-volatile memory 120 to detect a sensing value. This sensing value may correspond to the number of on-cells detected by a page buffer circuit, but the example embodiments are not limited thereto. In this case, the verify voltage may be a voltage Vp0 lower than the first voltage Vp1 as shown in FIG. 11, but is not limited thereto. In the pass check operation PF, the memory controller 110 may check and/or determine whether the first program state has passed using the count value corresponding to the number of on-cells and at least one reference value stored in advance in the control logic (e.g., 220 shown in FIG. 2), but the example embodiments are not limited thereto. When the first count value is less than or equal to the first reference value in the pass check operation PF, the operation of setting the second program voltage may be omitted and the first program loop 1 may be terminated, etc.

When the first program loop 1 ends, the non-volatile memory 120 may complete the program operation (PGM END).

As described above, since the program completion time (e.g., the duration of the program operation) at which the first program loop 1 starts and ends is reduced, the performance of the program operation for the SLC may be improved.

Figure 13:
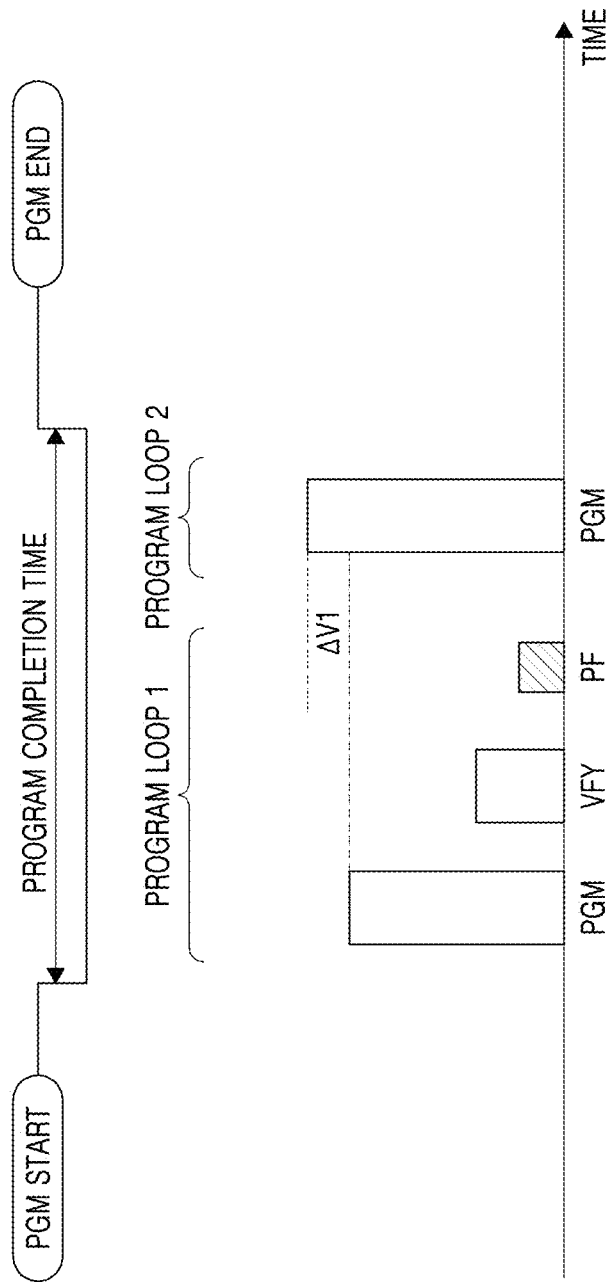
FIG. 13 is a diagram for explaining at least one example embodiment of a method of operating a program for a single-level cell.

FIG. 13 is a diagram for explaining another example method of operating a program for a SLC according to at least one example embodiment. In detail, FIG. 13 illustrates an example program operation method when the first count value obtained in the first program loop 1 is greater than the first reference value and less than or equal to the second reference value.

Referring to FIGS. 1, 10, 11, and 13, a program operation PGM, a verification operation VFY, and a pass check operation PF may be sequentially performed by a memory controller 110 during a first program loop 1, but the example embodiments are not limited thereto. The program operation PGM and the verification operation VFY may be the same as described above with reference to FIG. 12, but is not limited thereto. In the pass check operation PF, the first count value may be greater than the first reference value and less than or equal to the second reference value, etc. In this case, the second program voltage may be set according to the first count value, but the example embodiments are not limited thereto.

A second program loop 2 may be performed by the memory controller 110, and a program operation PGM may be performed during the second program loop 2. A difference ΔV1 between the first program voltage in the first program loop 1 and the second program voltage in the second program loop 2 may be proportional to the first count value, but is not limited thereto. When a program operation PGM in the second program loop 2 is performed, since it is expected that the memory cell has the first program state, the second program loop Program loop 2 may be terminated and a program operation may be completed PGM END. Although the program completion time shown in FIG. 13 is slightly increased than the program completion time shown in FIG. 12, as the program operation on the SLC is completed in the second program loop, there is an effect of improving the speed, efficiency, and/or power consumption of the program operation on the SLC.

Figure 14:
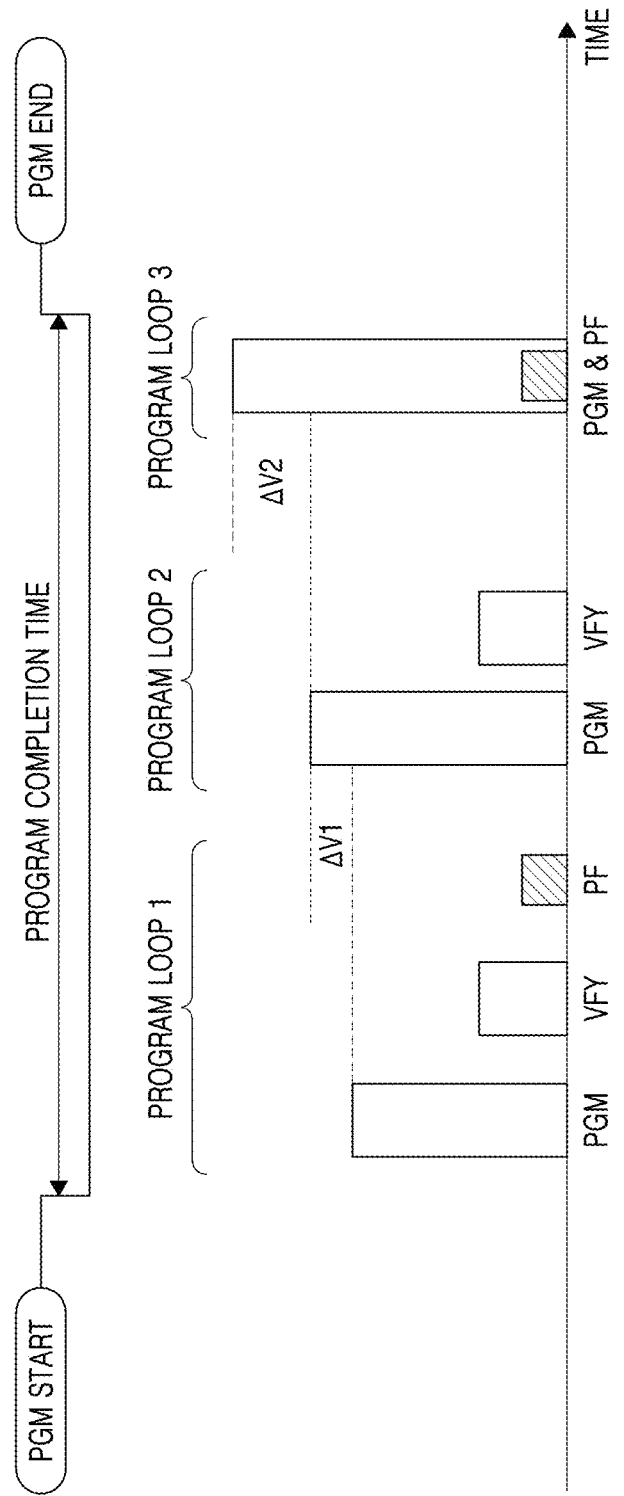
FIG. 14 is a diagram for explaining at least one example embodiment of a method of operating a program for a single-level cell.

FIG. 14 is a diagram for explaining another example method of operating a program for a SLC according to at least one example embodiment. In detail, FIG. 13 illustrates a program operation method when the first count value obtained in the first program loop 1 is greater than the second reference value.

Referring to FIGS. 1, 10, 11, and 14, a program operation PGM, a verification operation VFY, and a pass check operation PF may be sequentially performed during a first program loop 1. The program operation PGM and the verification operation VFY may be the same as described above with reference to FIG. 12, but is not limited thereto. In the pass check operation PF, the first count value may be greater than the second reference value, but is not limited thereto.

Unlike FIG. 13, since the first count value is greater than the second reference value, a program operation PGM and a verification operation VFY may be sequentially performed by the memory controller 110 during a second program loop Program loop 2. In the verification operation VFY, a second verify voltage may be used, and the second verify voltage may be the same as the first verify voltage. The second count value may be obtained through a verification operation VFY.

A third program loop Program loop 3 may be performed by the memory controller 110, and a program operation PGM and a pass check operation PF may be performed together by the memory controller 110 during the third program loop Program loop 3, but the example embodiments are not limited thereto. In a program operation PGM, a third program voltage may be applied. A difference $\Delta V2$ between the second program voltage in the second program loop 2 and the third program voltage in the third program loop 3 may be determined according to ISPP, but the example embodiments are not limited thereto. In the pass check operation PF, the memory controller 110 may check whether the first program state has been passed (and/or verified) by comparing the second count value with the first and second reference values, etc. The second count value may be obtained by the memory controller 110 by performing a verification operation VFY included in the second program loop 2 and temporarily stored in, e.g., the control logic 220, etc.

Although the program completion time shown in FIG. 14 is slightly increased than the program completion time shown in FIG. 13, as the program operation on the SLC is completed by at least the third program loop, there is an effect of improving the speed, efficiency, and/or power consumption of a program operation for a SLC.

Figure 15:
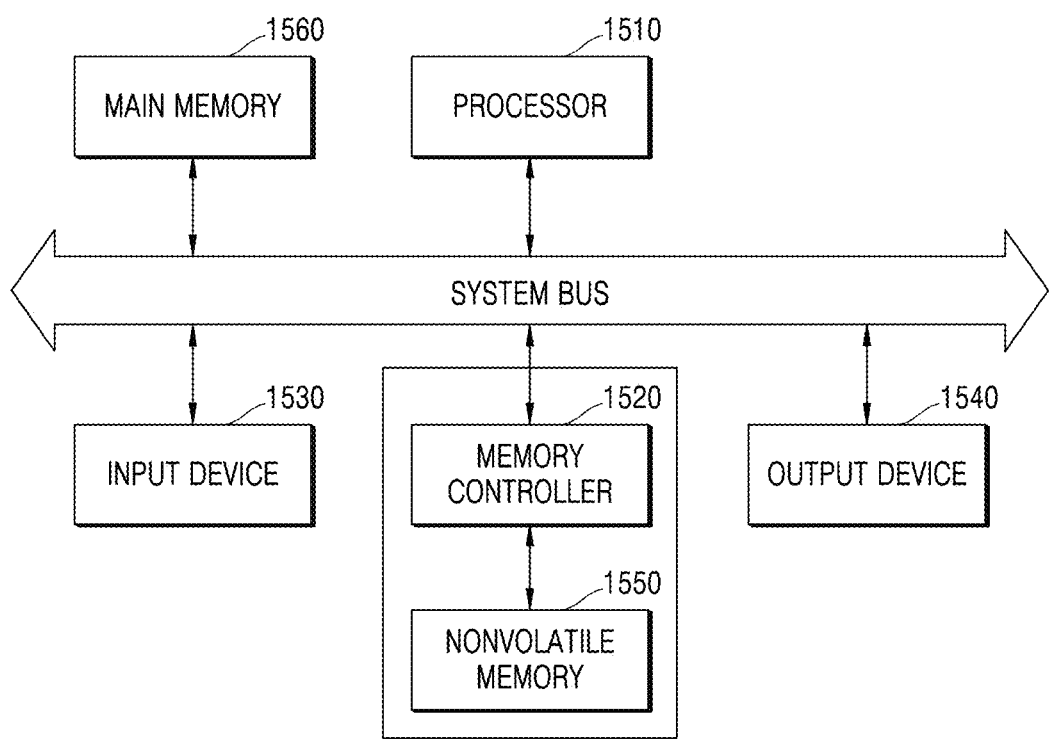
FIG. 15 is a block diagram illustrating a computing system according to at least one example embodiment.

FIG. 15 is a block diagram illustrating a computing system according to at least one example embodiment.

Referring to FIG. 15, a computing system 1500 includes at least one processor 1510 (e.g., processing circuitry, etc.), a memory controller 1520, input devices 1530, output devices 1540, a nonvolatile memory device 1550, and/or a main memory 1560, etc., but the example embodiments are not limited thereto, and for example, the computing system 1500 may include a greater or lesser number of constituent elements, etc. In the drawing, a solid line indicates a system bus through which data and/or commands are transferred.

The memory controller 1520 and the nonvolatile memory device 1550 may constitute a memory card. In addition, the processor 1510, the input devices 1530, the output devices 1540, and/or the main memory 1560 may constitute a host (e.g., a host device) using a memory card as a memory device, but the example embodiments are not limited thereto.

The computing system 1500 according to at least one example embodiment of the inventive concepts receives data from the outside (e.g., from external sources and/or external devices) through input devices 1530 (e.g., keyboard, mouse, camera, microphone, etc.). The input data may be at least one command entered by a user and/or data, such as multimedia data, image data by a camera, a sound recording, or the like. The input data is stored in the nonvolatile memory device 1550 and/or the main memory 1560, etc.

The processing result by the processor 1510 is stored in the nonvolatile memory device 1550 and/or the main memory 1560, etc. The output devices 1540 output data stored in the nonvolatile memory device 1550 and/or the main memory 1560. The output devices 1540 may output digital data in a human-sensible form. For example, the output device 1540 includes a display and/or a speaker, etc. The program method according to at least one example embodiment of the inventive concepts may be applied to the nonvolatile memory device 1550, but is not limited thereto. As the reliability of the nonvolatile memory device 1550 is improved, the reliability of the computing system 1500 will also be improved in proportion.

The nonvolatile memory device 1550 and/or the memory controller 1520 may be mounted using various types of packages. For example, the nonvolatile memory device 1550 and/or the controller 1520 may be mounted using packages, such as Package on Package (POP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc., but the example embodiments are not limited thereto.

The computing system 1500 may include a power supply for supplying power desired and/or required for the operation of the computing system 1500. In at least one example embodiment, when the computing system 1500 is a mobile device, the computing system 1500 may further include a battery for supplying operating power of the computing system 1500, etc.

Figure 16:
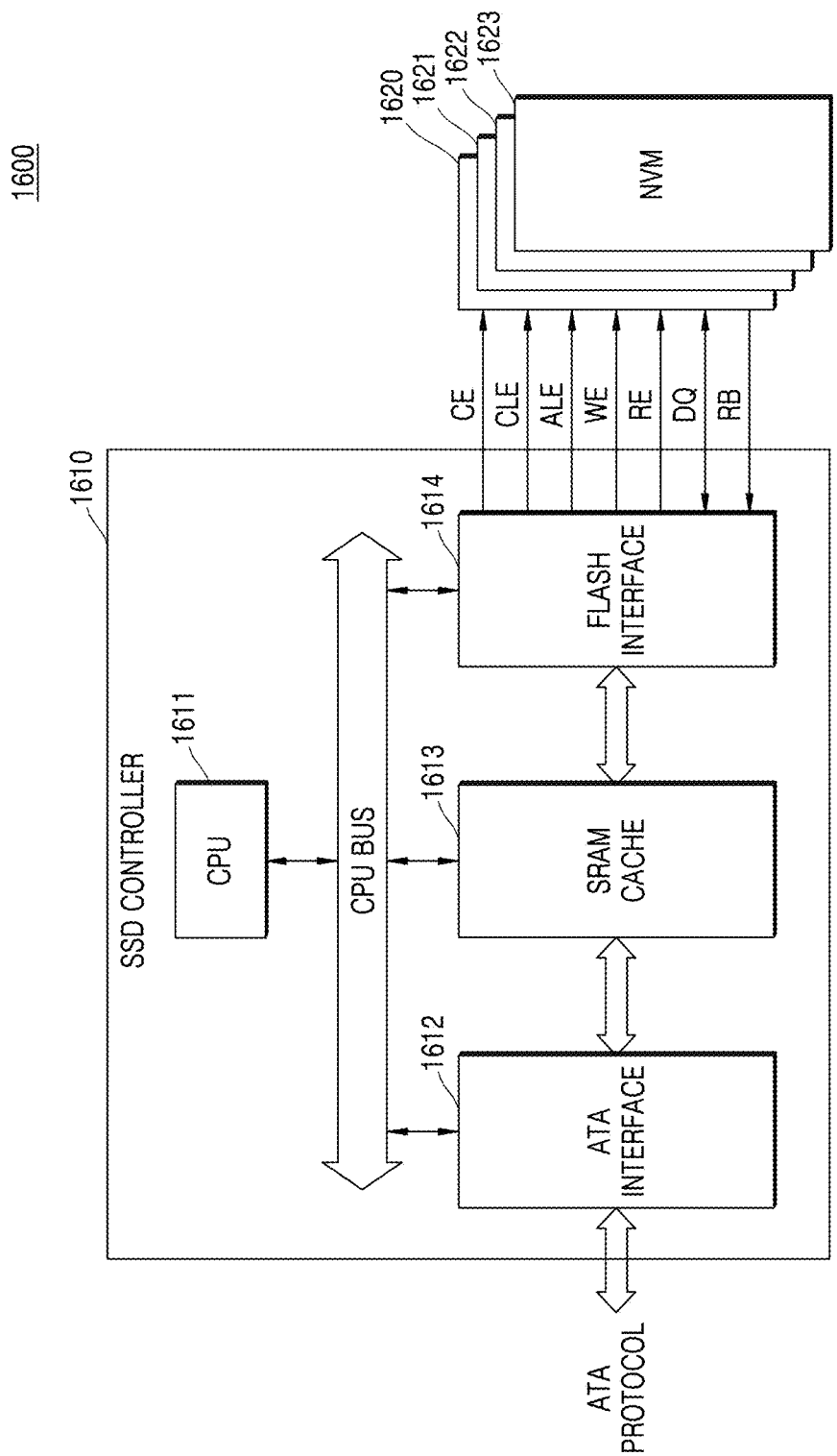
FIG. 16 is a block diagram illustrating a solid state device of a computing system according to at least one example embodiment.

FIG. 16 is a block diagram illustrating a solid state device of a computing system according to at least one example embodiment.

Referring to FIG. 16, a Solid State Drive (SSD) system 1600 includes an SSD controller 1610 and/or nonvolatile memory devices 1620 to 1623, etc.

The nonvolatile memory device according to at least one example embodiment of the inventive concepts may also be applied to an SSD, but is not limited thereto. SSD products, which are expected to replace and/or have replaced hard disk drives (HDDs), are attracting attention in the next-generation memory market. The SSD is a data storage device that uses memory chips such as flash memory to store data instead of a rotating plate used in a general hard disk drive. Compared to mechanically moving hard disk drives, SSDs have the advantages of being faster, more resistant to external shocks, and lower in power consumption.

The central processing unit (CPU) 1611 receives at least one command from the host (e.g., host device, etc.), determines whether to store data from the host in a nonvolatile memory device, and/or reads data stored in the nonvolatile memory device and transmits the read data to the host.

The ATA interface 1612 exchanges data with the host side under the control of the above-described CPU 1611. The ATA interface 1612 fetches commands and/or addresses from the host side and transmits the fetched commands and/or addresses to the CPU 1611 through the CPU bus. Data input from the host through the ATA interface 1612 and/or data to be transmitted to the host is transmitted through the SRAM cache 1613 without going through the CPU bus under the control of the CPU 1611, but the example embodiments are not limited thereto. The ATA interface 212 includes a serial ATA (S-ATA) standard and/or a parallel ATA (P-ATA) standard, but is not limited thereto.

The SRAM cache 1613 temporarily stores transfer data between the host and the nonvolatile memory devices 1620 to 1623. Also, the SRAM cache 1613 is used to store a program to be operated by the CPU 1611. The SRAM cache 1613 may be regarded as a type of buffer memory, and is not necessarily configured as SRAM, e.g., other types of memory may be used as the cache 1613, etc. The flash interface 1614 exchanges data with nonvolatile memories used as storage devices. The flash interface 1614 may be configured to support NAND flash memory, One-NAND flash memory, and/or multi-level flash memory, etc.

The semiconductor memory system according to at least one example embodiment of the inventive concepts may be used as a removable storage device, but is not limited thereto. Therefore, the semiconductor memory system may be used as a storage device for smartphones, tablets, wearable devices, Internet of Things (IoT) devices, MP3 players, digital camera, PDA, and/or e-Book devices, etc. Also, the semiconductor memory system may be used as a storage device such as a digital TV and/or a computer (e.g., desktop computer, laptop computer, server, etc.).

While various example embodiments of the inventive concepts have been particularly shown and described, it will be understood that various changes in form and details may be made therein without departing from the spirit and scope of the following claims.

What is claimed is:

1. A method for performing at least one program loop on a non-volatile memory device,
    wherein a first program loop of the at least one program loop comprises,
    performing a first program operation, the first program operation including applying a first program voltage to a selected word line of the non-volatile memory device, the selected word line connected to a plurality of memory cells;
    performing a first verification operation, the first verification operation including sensing a first sensing value corresponding to the plurality of memory cells based on a first verify voltage; and
    performing a pass check operation, the pass check operation including,
        counting a number of on-cells of the selected word line based on the first sensing value to determine a first count value,
        determining whether a first program state of the plurality of memory cells has been verified based on the first count value, a first reference value, and a second reference value,
        determining whether to execute a second program loop after the first program loop based on the first count value, the first reference value, and the second reference value, and
        determining whether to set a second program voltage for the second program loop based on the first count value, the first reference value, and the second reference value, and
    wherein the second reference value is greater than the first reference value.

2. The method of claim 1, wherein
    the pass check operation further comprises omitting setting the second program voltage in response to the first program state being successfully verified and the first count value being less than or equal to the first reference value.

3. The method of claim 2, wherein
    the plurality of memory cells comprise single-level cells; and
    the method further comprises terminating the first program loop.

4. The method of claim 1, wherein
    the pass check operation further comprises setting a magnitude of the second program voltage based on the first count value in response to the first program state being unsuccessfully verified and the first count value being greater than the first reference value.

5. The method of claim 4, wherein the method further comprises:
    performing the second program loop after the first program loop; and
    the second program loop further includes performing a second program operation including applying the second program voltage to the selected word line in response to the first count value being less than or equal to the second reference value.

6. The method of claim 5, wherein
    the plurality of memory cells comprises single-level cells; and
    the method further comprises terminating the second program loop.

7. The method of claim 4, wherein the second program loop further includes:
    performing a second program operation including applying the second program voltage to the selected word line in response to the first count value being greater than the second reference value, and
    performing a second verification operation including sensing a second sensing value corresponding to the plurality of memory cells based on a second verify voltage; and
    wherein the method further comprises,
        performing a third program loop after the second program loop, the third program loop comprising,
            applying a third program voltage higher than the second program voltage to the selected word line,
            counting a number of on-cells of the selected word line based on the second sensing value to determine a second count value, and
            determining whether the first program state of the plurality of memory cells has been successfully verified based on the second sensing value, the first reference value, and the second reference value.

8. The method of claim 7, wherein
    the plurality of memory cells comprise single-level cells; and
    the method further comprises,
        terminating the third program loop in response to the first program state being successfully verified.

9. The method of claim 1, wherein the first program voltage is set to different voltage values based on the selection of the selected word line.

10. A non-volatile memory device comprising:
    a memory cell array including a plurality of memory cells;
    a voltage generator connected to the memory cell array through a plurality of word lines;
    a page buffer circuit connected to the memory cell array through a plurality of bit lines; and
    control logic circuitry configured to perform at least one program loop on the plurality of memory cells,
    wherein the control logic circuitry performs a first program loop of the at least one program loop to a selected word line among the plurality of word lines, the first program loop including,
        controlling the voltage generator to apply a first program voltage to the selected word line during the first program loop,
        controlling the voltage generator to apply a first verify voltage to the selected word line during the first program loop,
        controlling the page buffer circuit to sense a first sensing value corresponding to the plurality of memory cells connected to the selected word line based on the first verify voltage, and performing a pass check operation, the pass check operation including, counting a number of on-cells of the selected word line based on the first sensing value to determine a first count value, determining whether a first program state of the plurality of memory cells has been successfully verified based on the first count value, a first reference value, and a second reference value, determining whether to execute a second program loop after the first program loop based on the first count value, the first reference value, and the second reference value, and determining whether to set a second program voltage for the second program loop based on the first count value, the first reference value, and the second reference value, and wherein the second reference value is greater than the first reference value.

11. The non-volatile memory device of claim 10, wherein the control logic circuitry is further configured to:

omit setting the second program voltage in response to the first count value being less than the first reference value, and set the second program voltage based on the first count value in response to the first count value being greater than the first reference value.

12. The non-volatile memory device of claim 11, wherein the plurality of memory cells comprise single-level cells; and the control logic circuitry is further configured to terminate the first program loop and complete a program operation in response to the first count value being less than the first reference value.

13. The non-volatile memory device of claim 11, wherein the control logic circuitry is further configured to:

control the voltage generator to apply the second program voltage to the selected word line in response to the first count value being greater than the first reference value and less than or equal to the second reference value.

14. The non-volatile memory device of claim 11, wherein the control logic circuitry is further configured to:

control the voltage generator to apply the second program voltage to the selected word line in response to the first count value being greater than the second reference value, control the voltage generator to apply a second verify voltage to the selected word line, and control the page buffer circuit to sense a second sensing value corresponding to the plurality of memory cells based on the second verify voltage, and control the voltage generator to apply a third program voltage higher than the second program voltage to the selected word line, count a number of on-cells of the selected word line based on the second sensing value to determine a second count value, and determine whether the first program state has been successfully verified based on the second count value, the first reference value, and the second reference value.

15. The non-volatile memory device of claim 10, wherein the control logic circuitry is further configured to set the first program voltage to different voltage values based on the selection of the selected word line.

16. A method for performing at least one program loop on a non-volatile memory device, the method comprising:

performing a first program loop on the non-volatile memory device, the first program loop including, performing a program operation on a selected word line of the non-volatile memory device, the program operation including applying a first program voltage;

performing a first verification operation, the first verification operation including sensing a first sensing value corresponding to a plurality of single-level cells connected to the selected word line based on a first verify voltage;

performing a pass check operation, the pass check operation including, counting a number of on-cells of the selected word line based on the first sensing value to determine a first count value, determining whether a program state of the plurality of single-level cells has been verified based on the first count value and a plurality of reference ranges, determining whether to execute a second program loop after the first program loop based on the first count value and the plurality of reference ranges, and determining whether to set a second program voltage for the second program loop based on the first count value and the plurality of reference ranges, and wherein the plurality of reference ranges includes a first reference range, a second reference range, and a third reference range.

17. The method of claim 16, wherein the pass check operation further includes:

omitting setting a second program voltage in response to the program state being successfully verified and the first count value being in the first reference range less than or equal to a first reference value; and the method further comprises, terminating the first program loop.

18. The method of claim 16, wherein the pass check operation further includes setting a magnitude of the second program voltage based on the first count value in response to the program state being unsuccessfully verified and the first count value being in the second reference range between a first reference value and a second reference value; and the method further comprises, performing the second program loop after the first program loop, and terminating the second program loop; and the second program loop includes performing a second program operation including applying the second program voltage to the selected word line in response to the first count value being in the third reference range greater than or equal to the second reference value greater than the first reference value.

19. The method of claim 16, wherein the pass check operation further includes setting a magnitude of the second program voltage based on the first count value in response to the program state of the selected word line being unsuccessfully verified and the first count value being in the third reference range greater than or equal to a second reference value greater than a first reference value; and the method further comprises, performing the second program loop after the first program loop, and performing a third program loop after the second program loop;

the second program loop further includes performing a second program operation including applying the second program voltage to the selected word line, and performing a second verification operation including sensing a second sensing value corresponding to the plurality of single-level cells based on a second verify voltage; and the third program loop includes,
applying a third program voltage higher than the second program voltage to the selected word line,
counting a number of on-cells of the selected word line based on the second sensing value to determine a second count value, and
determining the program state based on the second count value, the first reference value, and the second reference value.

20. The method of claim 19, wherein the method further comprises:
terminating the third program loop in response to the program state being successfully verified.

* * * * *